United States Patent
Tanaka et al.

(10) Patent No.: US 8,098,116 B2
(45) Date of Patent: Jan. 17, 2012

(54) LC COMPOSITE ELECTRONIC COMPONENT

(75) Inventors: Daisuke Tanaka, Kanagawa-ken (JP); Haruhiko Ueno, Fukui-ken (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 12/782,570

(22) Filed: May 18, 2010

(65) Prior Publication Data

US 2010/0225420 A1    Sep. 9, 2010

Related U.S. Application Data

(63) Continuation of application No. PCT/JP2008/070912, filed on Nov. 18, 2008.

(30) Foreign Application Priority Data

Nov. 22, 2007 (JP) ................................. 2007-303249
Nov. 13, 2008 (JP) ................................. 2008-290830

(51) Int. Cl.
*H01H 3/00* (2006.01)
*H01H 9/00* (2006.01)
(52) U.S. Cl. ......... 333/185; 333/175; 333/202; 333/205
(58) Field of Classification Search .................. 333/175, 333/185, 202–205
See application file for complete search history.

(56) References Cited

U.S. PATENT DOCUMENTS

2007/0001782 A1*   1/2007   Sasaki et al. .................. 333/185

FOREIGN PATENT DOCUMENTS

| JP | 2002-344274 A | 11/2002 |
|---|---|---|
| JP | 2005-064267 A | 3/2005 |
| JP | 2006-019936 A | 1/2006 |
| JP | 2006-025144 A | 1/2006 |
| JP | 2006-041632 A | 2/2006 |
| JP | 2006-041820 A | 2/2006 |
| WO | 2006/022115 A1 | 3/2006 |

OTHER PUBLICATIONS

International Search Report; PCT/JP2008/070912; Mar. 3, 2009.

* cited by examiner

*Primary Examiner* — Robert Pascal
*Assistant Examiner* — Kimberly Glenn
(74) *Attorney, Agent, or Firm* — Studebaker & Brackett PC; Tim L. Brackett, Jr.

(57) ABSTRACT

An LC composite electronic component, having a large noise suppression effect without increasing in size, includes a multilayer structure in which first and second capacitor units (10), (20) and first and second coil units (30), (40) are stacked and incorporates four LC resonance circuits. A noise circulating capacitance (C21) is formed between a coil electrode (31*a*) and a resonance adjusting electrode (51*a*), and a noise circulating capacitance (C22) is formed between a coil electrode (31*c*) and a resonance adjusting electrode (51*b*). A noise circulating capacitance (C23) is formed between a coil electrode (42*a*) and a resonance adjusting electrode (53*a*), and a noise circulating capacitance (C24) is formed between a coil electrode (42*c*) and a resonance adjusting electrode (53*b*). A noise circulating capacitance (C25) is formed between lead-out electrodes (32*a*), (41*b*), and a noise circulating capacitance (C26) is formed between lead-out electrodes (32*d*), (41*d*).

11 Claims, 25 Drawing Sheets

(A)

(B)

(A)

AMOUNT OF REFLECTION (dB)

FREQUENCY (MHz)

(B)

AMOUNT OF ATTENUATION (dB)

FREQUENCY (MHz)

(A) KNOWN EXAMPLE

INPUT        OUTPUT (B) EMBODIMENTS OF PRESENT INVENTION

INPUT        OUTPUT

FIRST INPUT PORT    FIRST OUTPUT PORT

SECOND OUTPUT PORT
SECOND INPUT PORT (A)

(B)

LC COMPOSITE ELECTRONIC COMPONENT

CROSS REFERENCE TO RELATED APPLICATIONS

The present application is a continuation of International Application No. PCT/JP2008/070912, filed Nov. 18, 2008, which claims priority to Japanese Patent Application No. 2007-303249 filed Nov. 22, 2007 and Japanese Patent Application No. 2008-290830 filed Nov. 13, 2008, the entire contents of each of these applications being incorporated herein by reference in their entirety.

BACKGROUND

1. Field of the Invention

The present invention relates to LC composite electronic components and, in particular, an LC composite electronic component including a plurality of inductor elements and capacitor elements.

2. Description of the Related Art

In general, to effectively reduce noise passing through signal wiring arranged on a circuit board, for example, to prevent degradation in reception sensitivity in a cellular phone, a noise filter is arranged at each signal wiring. Cellular phones are used in different frequency ranges depending on their communication systems. To effectively reduce noise in a cellular phone in any communication system, noise reduction over a wide range of approximately 800 MHz to 2 GHz is necessary.

One known traditional example of an LC composite electronic component in which a plurality of coil units having inductor elements and a plurality of capacitor units are stacked is described in Japanese Unexamined Utility Model Registration Application Publication No. 7-10914. To improve noise reduction effects in this kind of LC composite electronic component, it is necessary to set a filter constant (i.e., an L value and C value) at a large value. To have large L and C values, an increased number of layers stacked or an increased size of an electrode pattern is needed. This does not allow the LC composite electronic component to be kept compact.

SUMMARY

Embodiments consistent with the claimed invention can provide an LC composite electronic component that achieves a large noise suppression effect without having to increase its size.

According to an embodiment, there is provided an LC composite electronic component according to a first aspect, including:

a capacitor unit in which a ground electrode layer having a ground electrode formed on an insulating layer and a signal electrode layer having a signal electrode formed on an insulating layer are stacked; and a coil unit in which a coil electrode layer having a coil electrode formed on an insulating layer is stacked, wherein the capacitor unit and the coil unit are stacked to form a multilayer structure, the LC composite electronic component further includes:
first and second external electrodes disposed at the multilayer structure;
a first lead-out electrode included in the coil unit and coupling a first end of the coil electrode and the first external electrode; and a second lead-out electrode included in the coil unit and coupling a second end of the coil electrode and the second external electrode, wherein the signal electrode is coupled to the coil electrode with the first external electrode and the first lead-out electrode disposed therebetween, and a noise circulating capacitance is formed between coil electrodes coupled to the second lead-out electrode.

The LC composite electronic component according to the first aspect includes a plurality of LC resonance circuits in the multilayer structure using the capacitor unit and the coil unit and reduces noise passing through signal wiring. Accordingly, the generation of the noise circulating capacitance between coil electrodes formed in the multilayer structure enables controlling noise reflection and reducing noise.

The LC composite electronic component according to the first aspect may include a plurality of capacitor units and/or coil units. The noise circulating capacitance may be formed at opposing locations between the coil electrodes coupled to the second lead-out electrode, or alternatively, may be formed at opposing locations between the second lead-out electrodes.

The coil unit may include at least first and second coil units, the first coil unit may include a resonance adjusting electrode formed on an insulating layer, and the noise circulating capacitance may be formed between the resonance adjusting electrode and the coil electrode coupled to the first lead-out electrode of the second coil unit. The noise circulating capacitance may be formed between the resonance adjusting electrode and the first lead-out electrode of the second coil unit.

In another embodiment, there is provided an LC composite electronic component according to a second aspect, including:

a capacitor unit in which a ground electrode layer having a ground electrode formed on an insulating layer and a signal electrode layer having a signal electrode formed on an insulating layer are stacked;

a coil unit in which a coil electrode layer having a coil electrode formed on an insulating layer is stacked; and a noise circulating capacitance electrode layer having a noise circulating capacitance electrode formed on an insulating layer;

wherein the capacitor unit, the coil unit, and the noise circulating capacitance electrode layer are stacked to form a multilayer structure, the LC composite electronic component further includes:
first and second external electrodes disposed at the multilayer structure;
a first lead-out electrode included in the coil unit and coupling a first end of the coil electrode and the first external electrode; and a second lead-out electrode included in the coil unit and coupling a second end of the coil electrode and the second external electrode, wherein the signal electrode is coupled to the coil electrode with the first external electrode and the first lead-out electrode disposed therebetween, and a noise circulating capacitance is formed between the coil electrodes with the noise circulating capacitance electrode disposed therebetween.

The LC composite electronic component according to the second aspect includes a plurality of LC resonance circuits in the multilayer structure using the capacitor unit and the coil unit and reduces noise passing through signal wiring. At this time, the generation of the noise circulating capacitance between the coil electrodes formed in the multilayer structure with the noise circulating capacitance electrode disposed therebetween enables controlling noise reflection and reducing noise.

The LC composite electronic component according to the second aspect may include a plurality of capacitor units and/or coil units. The noise circulating capacitance may be formed between the second lead-out electrodes with the noise circulating capacitance electrode disposed therebetween.

In another embodiment, there is provided an LC composite electronic component according to a third aspect, including:

a first capacitor unit in which a first ground electrode layer having a first ground electrode formed on an insulating layer and a first signal electrode layer having a first signal electrode formed on an insulating layer are stacked;

a first coil unit in which a first coil electrode layer having a first coil electrode formed on an insulating layer is stacked;

a second capacitor unit in which a second ground electrode layer having a second ground electrode formed on an insulating layer and a second signal electrode layer having a second signal electrode formed on an insulating layer are stacked; and a second coil unit in which a second coil electrode layer having a second coil electrode formed on an insulating layer is stacked, wherein the first capacitor unit, the first coil unit, the second capacitor unit, and the second coil unit are stacked to form a multilayer structure, and a noise circulating capacitance is formed between the first and second coil units.

The LC composite electronic component according to the third aspect includes a plurality of LC resonance circuits in the multilayer structure using the first capacitor unit and first coil unit and the second capacitor unit and second coil unit and reduces noise passing through signal wiring. Accordingly, the generation of the noise circulating capacitance between the first and second coil units enables controlling noise reflection and reducing noise.

The LC composite electronic component according to the third aspect may further comprise a noise circulating capacitance electrode layer having a noise circulating capacitance electrode formed on an insulating layer, the noise circulating capacitance layer being stacked between the first and second coil units. Alternatively, the noise circulating capacitance may be formed by stacking the first coil electrode layer and the second coil electrode layer so as to face each other.

The first coil electrode layer in the first coil unit may comprise a plurality of first coil electrode layers, a first end of each of the first coil electrodes may be coupled to the first signal electrode, and a second end thereof may be coupled to a first external electrode. The second coil electrode layer in the second coil unit may comprise a plurality of second coil electrode layers, a first end of each of the second coil electrodes may be coupled to the second signal electrode, and a second end thereof may be coupled to a second external electrode. The coil electrode forming the second end of each of the first coil electrode and the second coil electrode may form the noise circulating capacitance.

In the LC composite electronic component according to each of the first, second, and third aspects, the noise circulating capacitance may preferably be 2 to 7 pF.

In the embodiments consistent with the claimed invention, the noise circulating capacitance generated by circulation of noise flowing into a plurality of LC resonance circuits made up of the coil unit and the capacitor unit in the coil electrodes enables controlling noise reflection and effectively reducing noise. It is not necessary to significantly increase the number of layers stacked and increase the size of an electrode pattern, so the LC composite electronic component can be kept compact.

BRIEF DESCRIPTION OF DRAWINGS

Features, elements, characteristics and advantages of the embodiments consistent with the claimed invention will become more apparent from the following detailed description with reference to the attached drawings.

DETAILED DESCRIPTION

LC composite electronic components according to various exemplary embodiments consistent with the claimed invention are described below with reference to the accompanying drawings. The same references are retained for elements and sections common to the embodiments described below, and the description thereof is not repeated.

Figure 1:
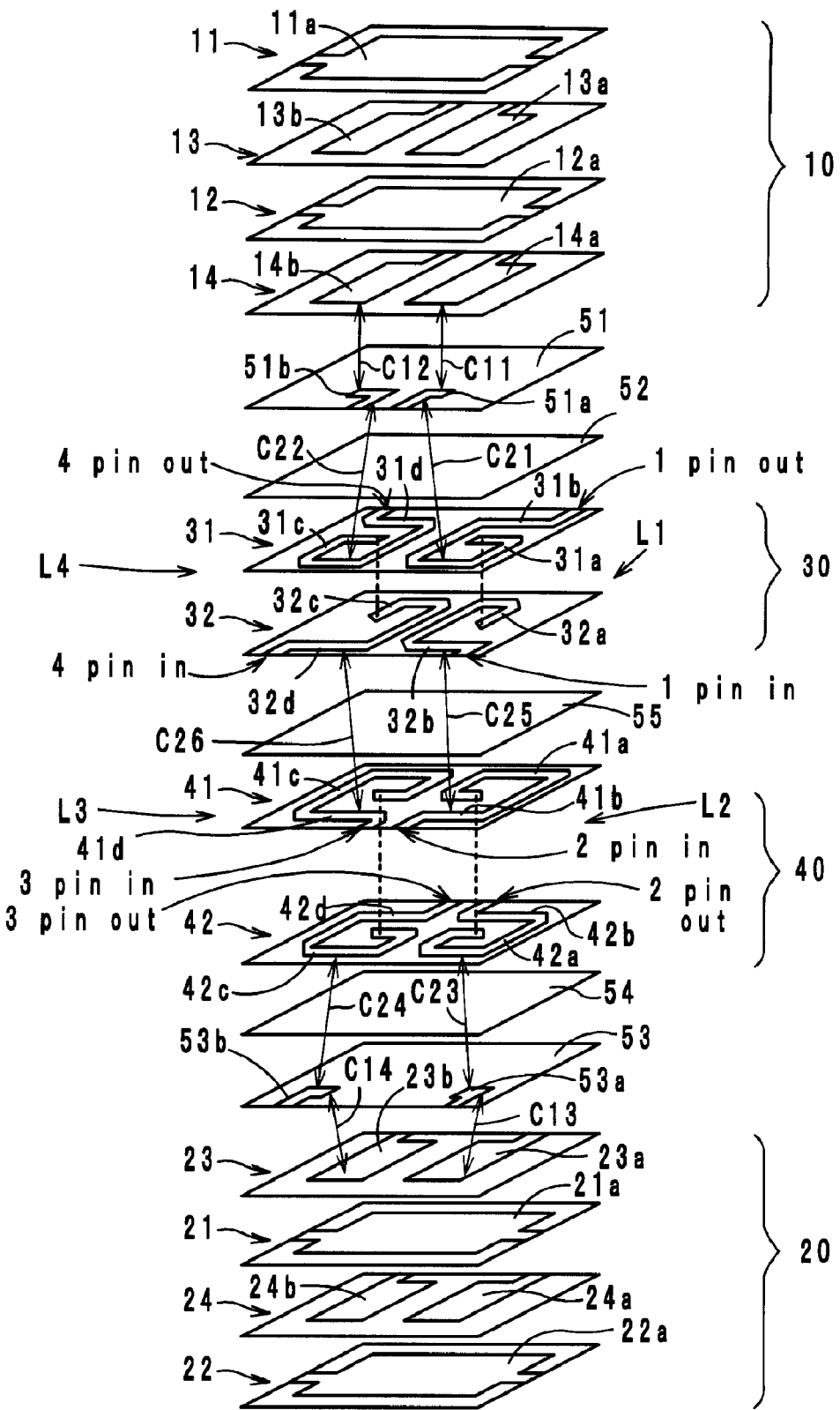
FIG. 1 is an exploded perspective view illustrating an LC composite electronic component according to a first embodiment.
Figure 2:
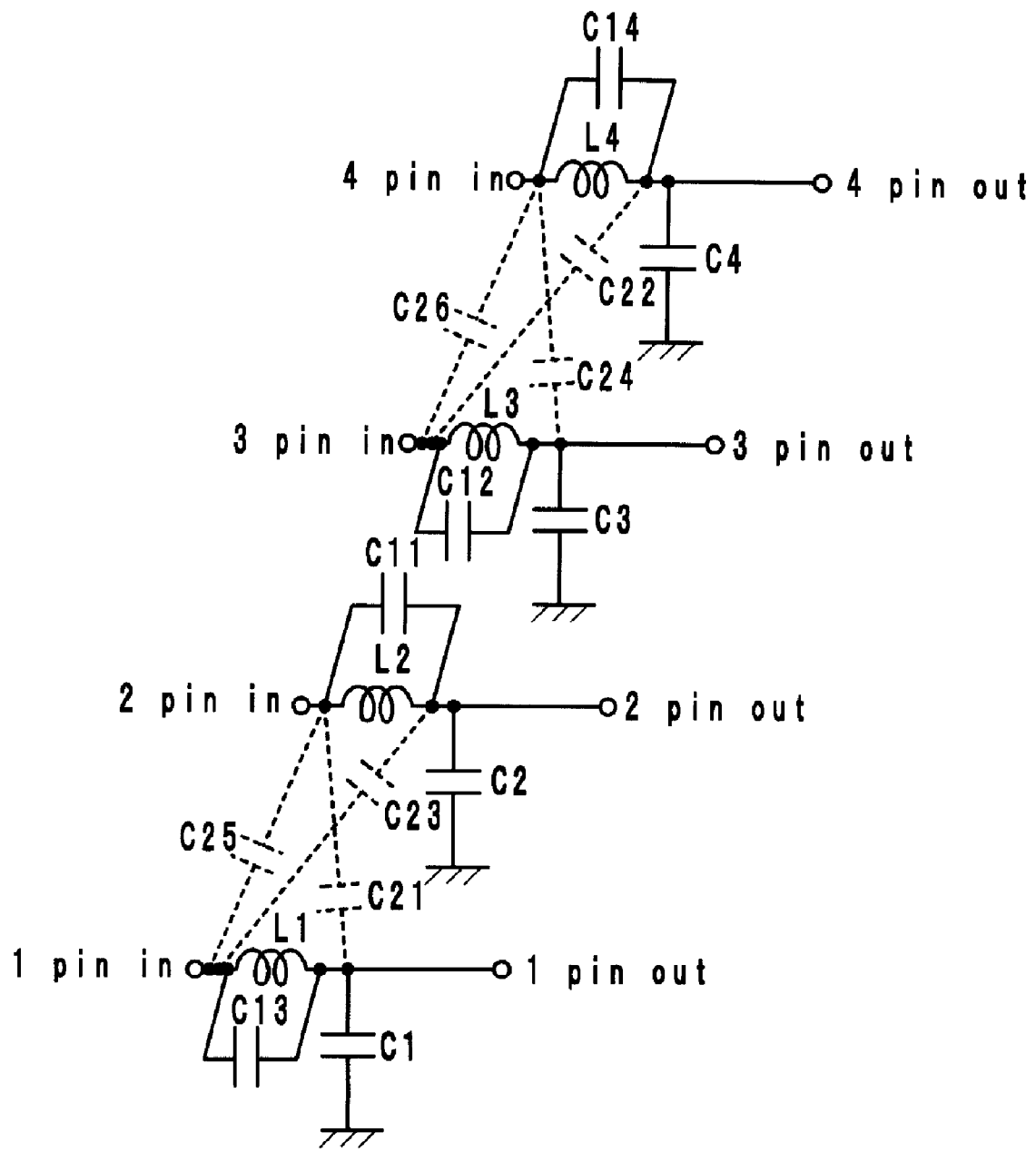
FIG. 2 is an equivalent circuit diagram of the first embodiment.

An exploded perspective view of an LC composite electronic component (noise filter array) according to a first embodiment is illustrated in FIG. 1, and its equivalent circuit diagram is illustrated in FIG. 2. This LC composite electronic component generally includes a multilayer structure in which first and second capacitor units 10 and 20 and first and second coil units 30 and 40 are stacked. Each of the upper and lower surfaces of the multilayer structure is overlaid with an insulating layer (not illustrated) as an outer layer member. The same applies to the other exemplary embodiments.

The first capacitor unit 10 is the one in which a ground electrode layer 11 having a ground electrode 11a, a ground electrode layer 12 having a ground electrode 12a, a signal electrode layer 13 having signal electrodes 13a and 13b, and a signal electrode layer 14 having signal electrodes 14a and 14b, each of these electrodes being formed on an insulating layer (e.g., a ceramic sheet, as applies thereafter), are stacked. The second capacitor unit 20 is the one in which a ground electrode layer 21 having a ground electrode 21a, a ground electrode layer 22 having a ground electrode 22a, a signal electrode layer 23 having signal electrodes 23a and 23b, and a signal electrode layer 24 having signal electrodes 24a and 24b, each of these electrodes being formed on an insulating layer, are stacked. The stack of these electrode layers forms capacitors C1, C2, C3, and C4, as shown in, e.g., FIG. 2.

The first coil unit 30 is the one in which a coil electrode layer 31 having coil electrodes 31a and 31c (including lead-out electrodes 31b and 31d) and a coil electrode layer 32 having coil electrodes 32a and 32c (including lead-out electrodes 32b and 32d), each of these electrodes being formed on an insulating layer, are stacked. The second coil unit 40 is the one in which a coil electrode layer 41 having coil electrodes 41a and 41c (including lead-out electrodes 41b and 41d) and a coil electrode layer 42 having coil electrodes 42a and 42c (including lead-out electrodes 42b and 42d), each of these electrodes being formed on an insulating layer, are stacked. The stack of these electrode layers spirally couples the coil electrodes with via holes disposed therebetween in the insulating layers and forms coils L1, L2, L3, and L4, as shown in, e.g., FIG. 2.

An electrode layer having resonance adjusting electrodes 51a and 51b formed on an insulating layer 51 and a solid-color insulating layer 52 are stacked between the first capacitor unit 10 and the first coil unit 30. An electrode layer having resonance adjusting electrodes 53a and 53b formed on an insulating layer 53 and a solid-color insulating layer 54 are stacked between the second capacitor unit 20 and the second coil unit 40. A solid-color insulating layer 55 is stacked between the first coil unit 30 and the second coil unit 40.

Although only their locations are illustrated in FIG. 1, external electrodes 1pin in, 1pin out, 2pin in, 2pin out, 3pin in, 3pin out, 4pin in, and 4pin out are formed on surfaces of the above multilayer structure, as shown in, e.g., FIG. 2. The lead-out electrode 31b disposed at an end of the coil electrode 31a is coupled to the external electrode 1pin out. The lead-out electrode 31d disposed at an end of the coil electrode 31c is coupled to the external electrode 4pin out. The lead-out electrode 32b disposed at an end of the coil electrode 32a is coupled to the external electrode 1pin in. The lead-out electrode 32d disposed at an end of the coil electrode 32c is coupled to the external electrode 4pin in.

The lead-out electrode 41b disposed at an end of the coil electrode 41a is coupled to the external electrode 2pin in. The lead-out electrode 41d disposed at an end of the coil electrode 41c is coupled to the external electrode 3pin in. The lead-out electrode 42b disposed at an end of the coil electrode 42a is coupled to the external electrode 2pin out. The lead-out electrode 42d disposed at an end of the coil electrode 42c is coupled to the external electrode 3pin out.

The signal electrodes 13a and 14a are coupled to the external electrode 2pin out. The signal electrodes 13b and 14b are coupled to the external electrode 3pin out. The signal electrodes 23a and 24a are coupled to the external electrode 1pin out. The signal electrodes 23b and 24b are coupled to the external electrode 4pin out.

The above-described capacitor units 10 and 20 and coil units 30 and 40 form the equivalent circuit illustrated in FIG. 2. LC resonance circuits made up of L1 and C1, L2 and C2, L3 and C3, and L4 and C4 are formed between input and output external electrodes and function as a noise filter.

The resonance adjusting electrode 51a is coupled to the external electrode 2pin in. The resonance adjusting electrode 51a and the signal electrode 14a form a capacitance C11 for use in resonance adjustment. The resonance adjusting electrode 51b is coupled to the external electrode 3pin in. The resonance adjusting electrode 51b and the signal electrode 14b form a capacitance C12 for use in resonance adjustment. The resonance adjusting electrode 53a is coupled to the external electrode 1pin in. The resonance adjusting electrode 53a and the signal electrode 23a form a capacitance C13 for use in resonance adjustment. The resonance adjusting electrode 53b is coupled to the external electrode 4pin in. The resonance adjusting electrode 53b and the signal electrode 23b form a capacitance C14 for use in resonance adjustment.

A noise circulating capacitance C21 is formed between the coil electrode 31a and the resonance adjusting electrode 51a. A noise circulating capacitance C22 is formed between the coil electrode 31c and the resonance adjusting electrode 51b. A noise circulating capacitance C23 is formed between the coil electrode 42a and the resonance adjusting electrode 53a. A noise circulating capacitance C24 is formed between the coil electrode 42c and the resonance adjusting electrode 53b. A noise circulating capacitance C25 is formed between the lead-out electrode 32b and the lead-out electrode 41b. A noise circulating capacitance C26 is formed between the lead-out electrode 32d and the lead-out electrode 41d.

Figure 3:
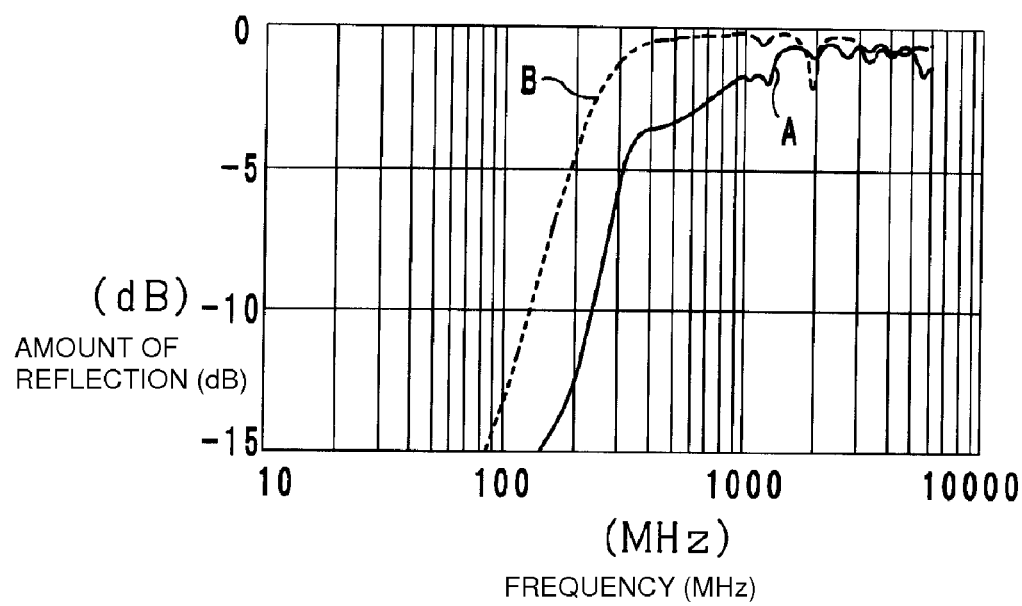
FIG. 3 is a graph illustrating reflection characteristics and attenuation characteristics of the first embodiment.
Figure 3:
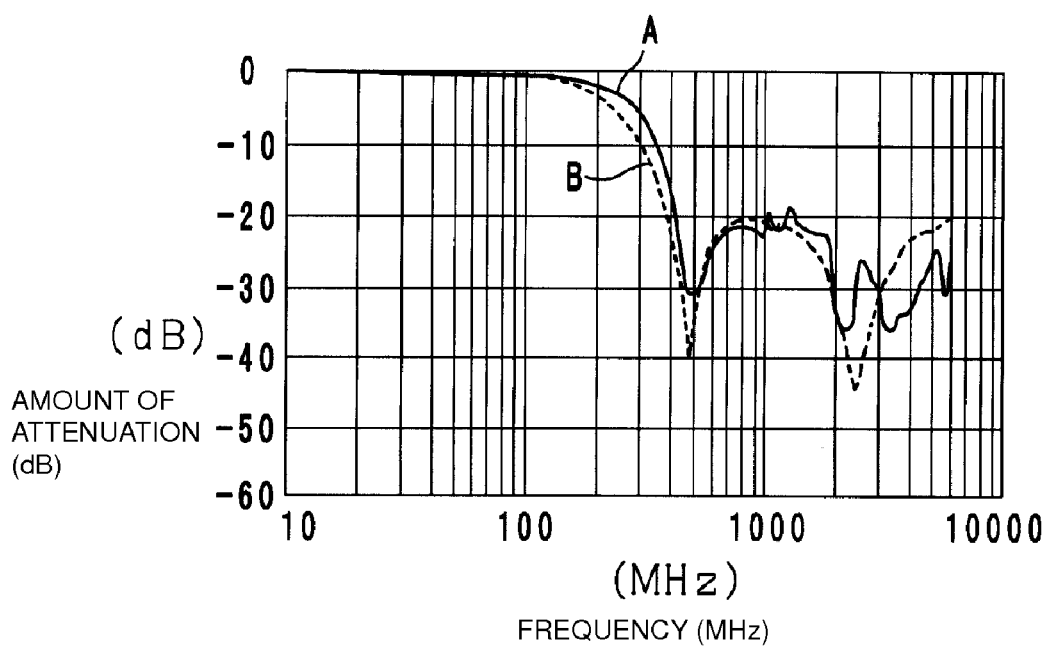

As described above, generation of the noise circulating capacitances C21 to C26 in the multilayer structure enables controlling noise reflection and reducing noise. Reflection characteristics of the first embodiment are indicated with the curve A illustrated in FIG. 3(A), and attenuation characteristics thereof are indicated with the curve A illustrated in FIG. 3(B). The curves B illustrate reflection characteristics and attenuation characteristics of a noise filter described in the above-mentioned Japanese Unexamined Utility Model Registration Application Publication No. 7-10914.

Figure 4:
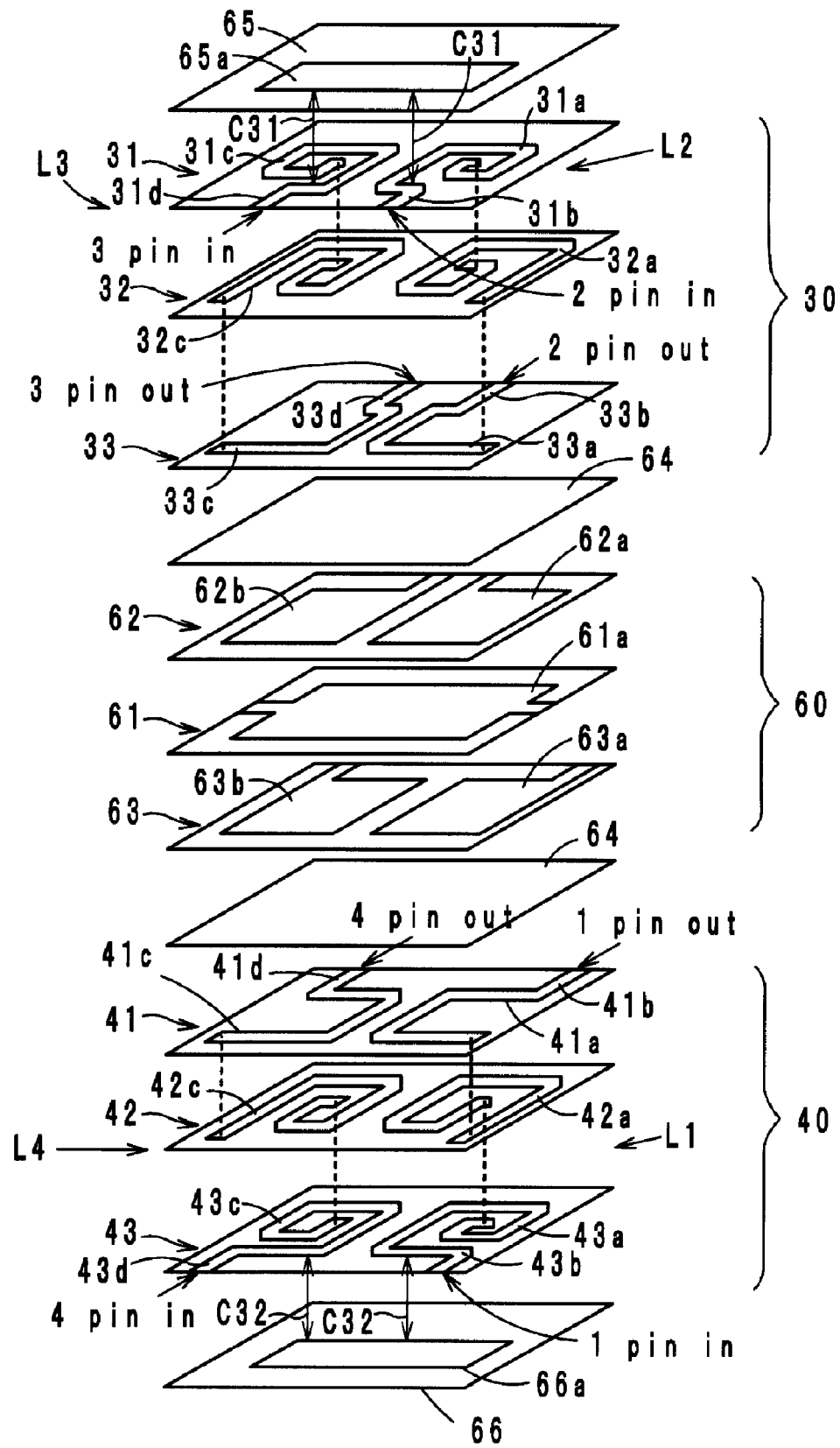
FIG. 4 is an exploded perspective view illustrating an LC composite electronic component according to a second embodiment.
Figure 5:
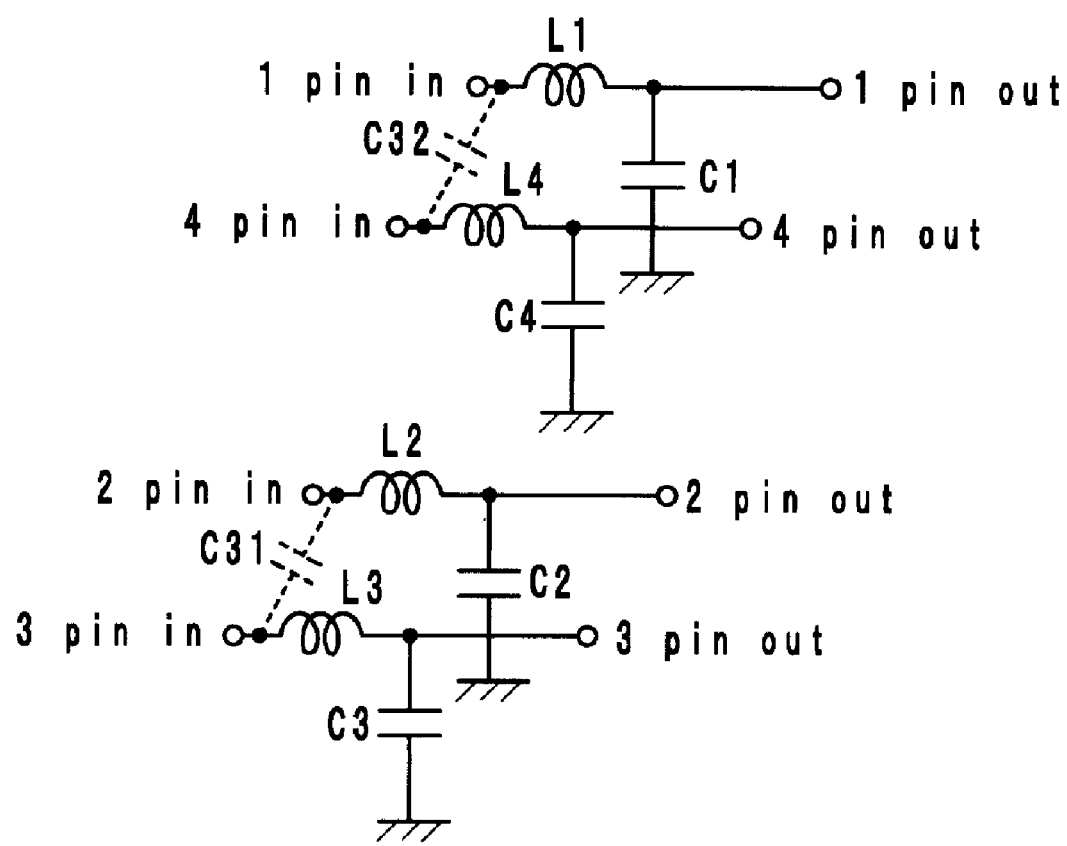
FIG. 5 is an equivalent circuit diagram of the second embodiment.

An exploded perspective view of an LC composite electronic component (noise filter array) according to a second embodiment is illustrated in FIG. 4, and its equivalent circuit diagram is illustrated in FIG. 5. This LC composite electronic component generally includes a multilayer structure in which a capacitor unit 60 and the first and second coil units 30 and 40 are stacked.

The capacitor unit 60 is the one in which a ground electrode layer 61 having a ground electrode 61a, a signal electrode layer 62 having signal electrodes 62a and 62b, and a signal electrode layer 63 having signal electrodes 63a and 63b, each of these electrodes being formed on an insulating layer, are stacked. The stack of these electrode layers forms the capacitors C1, C2, C3, and C4, as shown in, e.g., FIG. 5.

The first coil unit 30 is the one in which the coil electrode layer 31 having the coil electrodes 31a and 31c (including the lead-out electrodes 31b and 31d), the coil electrode layer 32 having the coil electrodes 32a and 32c, and a coil electrode layer 33 having coil electrodes 33a and 33c (including lead-out electrodes 33b and 33d), each of these electrodes being formed on an insulating layer, are stacked. The second coil unit 40 is the one in which the coil electrode layer 41 having the coil electrodes 41a and 41c (including the lead-out electrodes 41b and 41d), the coil electrode layer 42 having the coil electrodes 42a and 42c, and a coil electrode layer 43 having coil electrodes 43a and 43c (including lead-out electrodes 43b and 43d), each of these electrodes being formed on an insulating layer, are stacked. The stack of these electrode layers spirally couples the coil electrodes with via holes disposed therebetween in the insulating layers and forms the coils L1, L2, L3, and L4, as shown in, e.g., FIG. 5.

Solid-color insulating layers 64 are stacked between the capacitor unit 60 and each of the coil units 30 and 40. An electrode layer having a noise circulating capacitance electrode 65a formed on an insulating layer 65 is stacked on the upper surface of the first coil unit 30. An electrode layer having a noise circulating capacitance electrode 66a formed on an insulating layer 66 is stacked on the lower surface of the second coil unit 40.

Although only their locations are illustrated in FIG. 4, the external electrodes 1pin in, 1pin out, 2pin in, 2pin out, 3pin in, 3pin out, 4pin in, and 4pin out are formed on surfaces of the above multilayer structure, as shown in, e.g., FIG. 5. The lead-out electrode 31b disposed at an end of the coil electrode 31a is coupled to the external electrode 2pin in. The lead-out electrode 31d disposed at an end of the coil electrode 31c is coupled to the external electrode 3pin in. The lead-out electrode 33b disposed at an end of the coil electrode 33a is coupled to the external electrode 2pin out. The lead-out electrode 33d disposed at an end of the coil electrode 33c is coupled to the external electrode 3pin out.

The lead-out electrode 41b disposed at an end of the coil electrode 41a is coupled to the external electrode 1pin out. The lead-out electrode 41d disposed at an end of the coil electrode 41c is coupled to the external electrode 4pin out. The lead-out electrode 43b disposed at an end of the coil electrode 43a is coupled to the external electrode 1pin in. The lead-out electrode 43d disposed at an end of the coil electrode 43c is coupled to the external electrode 4pin in.

The signal electrode 62a is coupled to the external electrode 2pin out. The signal electrode 62b is coupled to the external electrode 3pin out. The signal electrode 63a is coupled to the external electrode 1pin out. The signal electrode 63b is coupled to the external electrode 4pin out.

The above-described capacitor unit 60 and coil units 30 and 40 form the equivalent circuit illustrated in FIG. 5. The LC resonance circuits made up of L1 and C1, L2 and C2, L3 and C3, and L4 and C4 are formed between input and output external electrodes and function as a noise filter.

Figure 6:
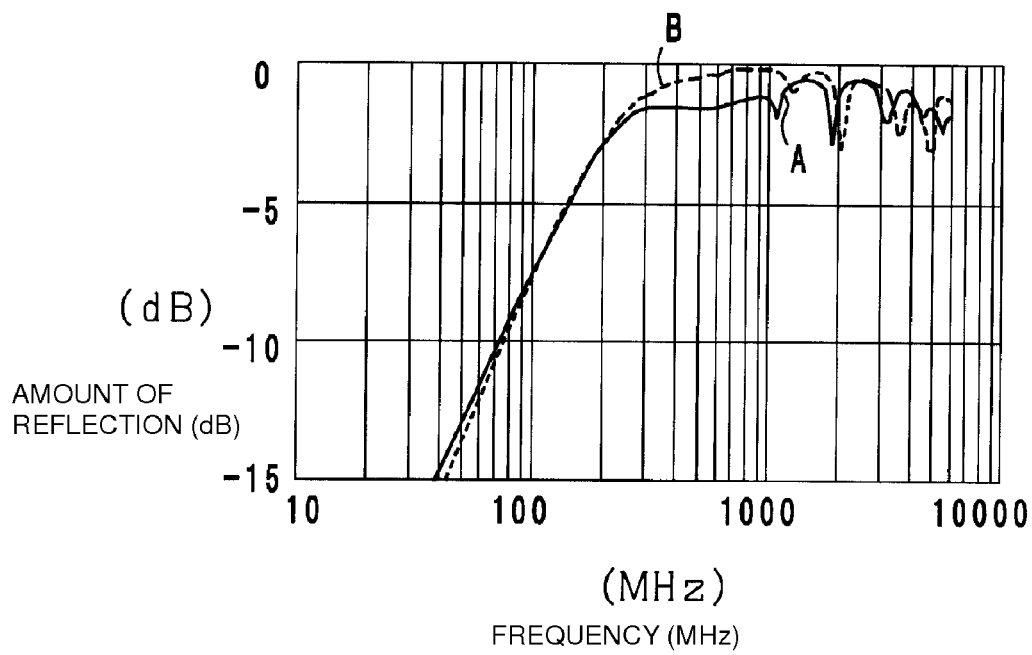
FIG. 6 is a graph illustrating reflection characteristics and attenuation characteristics of the second embodiment.
Figure 6:
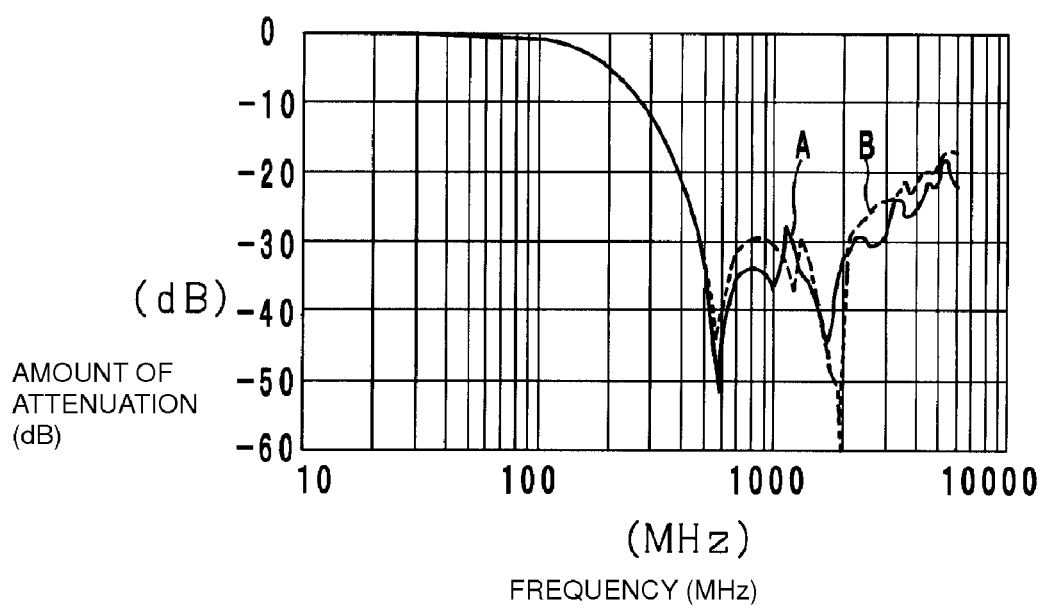

A noise circulating capacitance C31 is formed between the noise circulating capacitance electrode 65a and each of the lead-out electrodes 31b and 31d. A noise circulating capacitance C32 is formed between the noise circulating capacitance electrode 66a and each of the lead-out electrodes 43b and 43d. In this way, generation of the noise circulating capacitances C31 and C32 in the multilayer structure enables controlling noise reflection and reducing noise. Reflection characteristics of the second embodiment are indicated with the curve A illustrated in FIG. 6(A), and attenuation characteristics thereof are indicated with the curve A illustrated in FIG. 6(B). The curves B illustrate reflection characteristics and attenuation characteristics of a noise filter described in the above-mentioned Japanese Unexamined Utility Model Registration Application Publication No. 7-10914.

Figure 7:
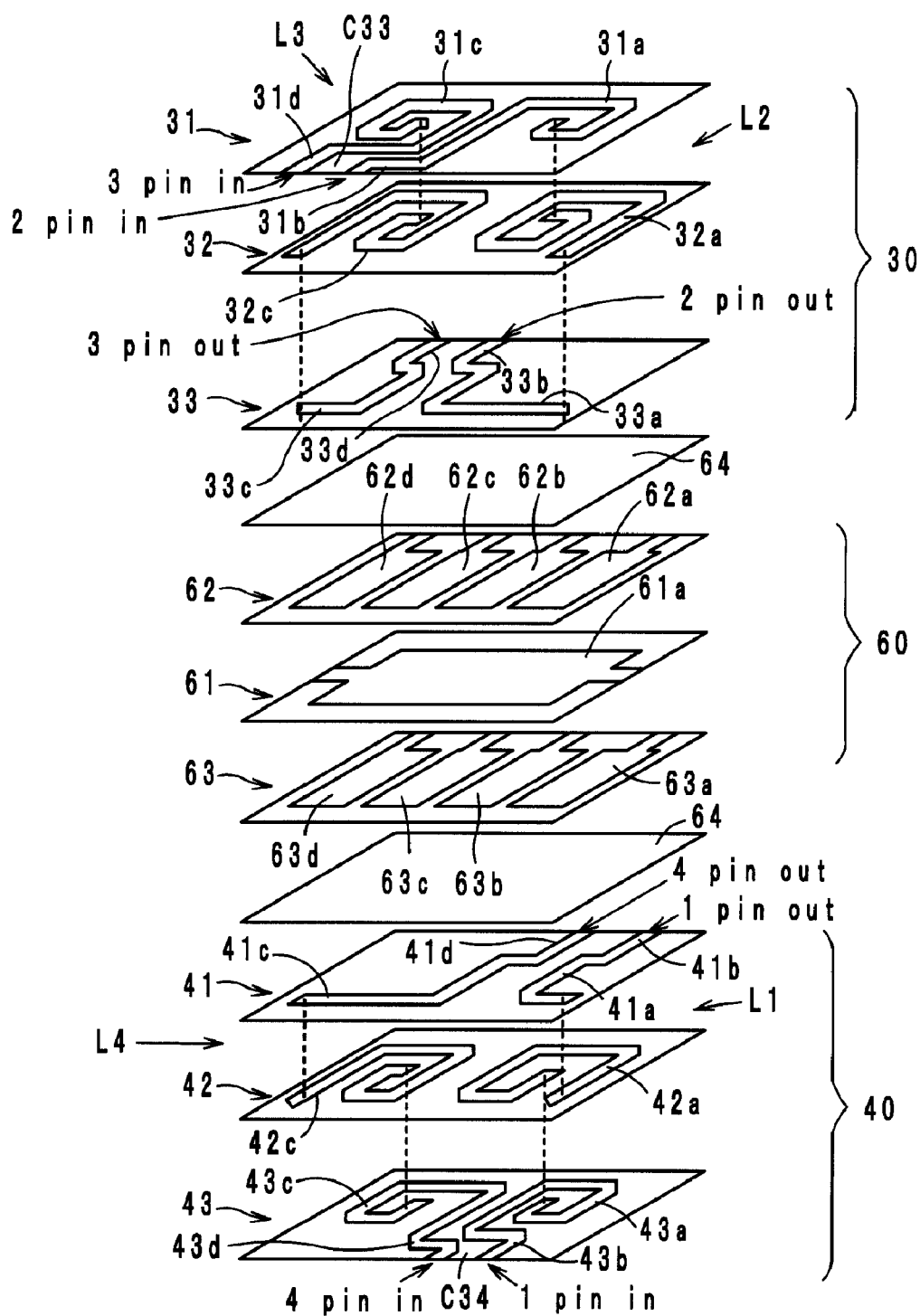
FIG. 7 is an exploded perspective view illustrating an LC composite electronic component according to a third embodiment.
Figure 8:
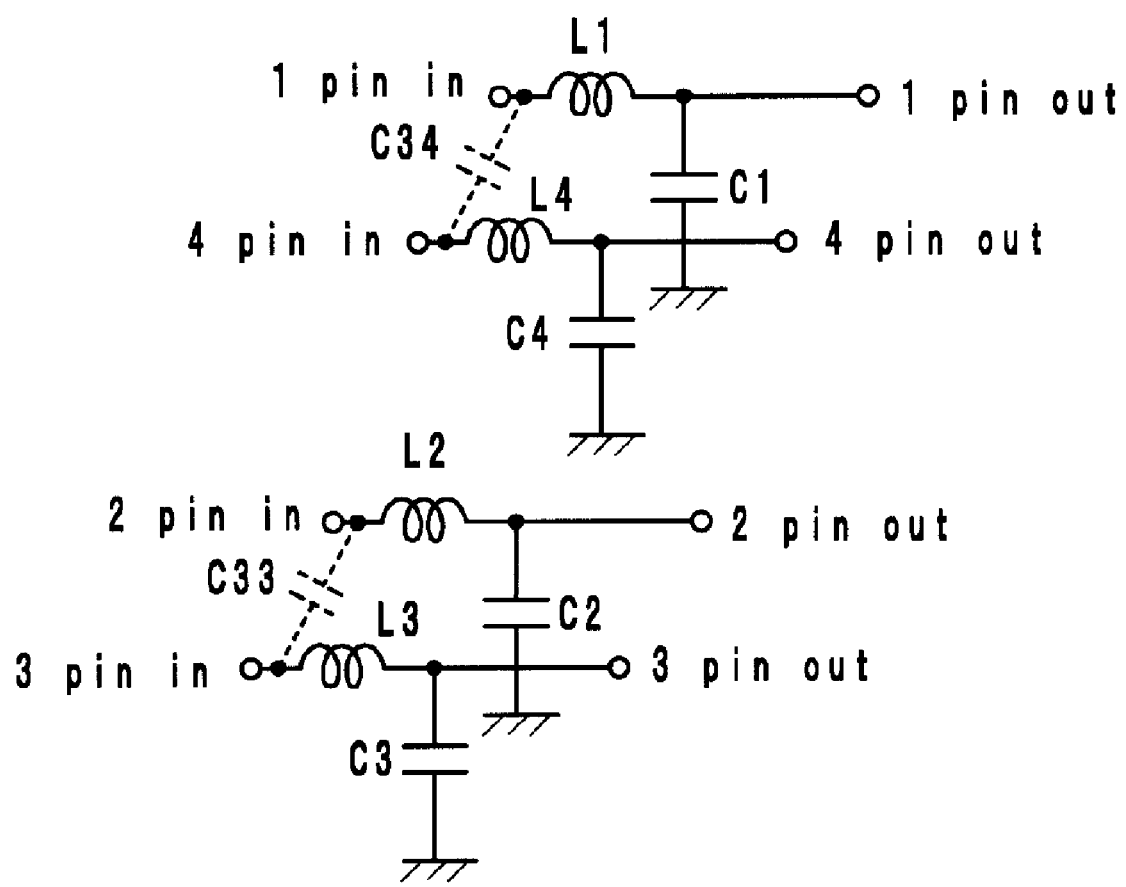
FIG. 8 is an equivalent circuit diagram of the third embodiment.

An exploded perspective view of an LC composite electronic component (noise filter array) according to a third embodiment is illustrated in FIG. 7, and its equivalent circuit diagram is illustrated in FIG. 8. This LC composite electronic component generally includes a multilayer structure in which the capacitor unit 60 and the first and second coil units 30 and 40 are stacked.

The capacitor unit 60 is the one in which the ground electrode layer 61 having the ground electrode 61a, the signal electrode layer 62 having the signal electrodes 62a and 62b and signal electrodes 62c and 62d, and the signal electrode layer 63 having the signal electrodes 63a and 63b and signal electrodes 63c and 63d, each of these electrodes being formed on an insulating layer, are stacked. The stack of these electrode layers forms the capacitors C1, C2, C3, and C4 (see FIG. 8).

The first coil unit 30 is the one in which the coil electrode layer 31 having the coil electrodes 31a and 31c (including the lead-out electrodes 31b and 31d), the coil electrode layer 32 having the coil electrodes 32a and 32c, and the coil electrode layer 33 having the coil electrodes 33a and 33c (including the lead-out electrodes 33b and 33d), each of these electrodes being formed on an insulating layer, are stacked. The second coil unit 40 is the one in which the coil electrode layer 41 having the coil electrodes 41a and 41c (including the lead-out electrodes 41b and 41d), the coil electrode layer 42 having the coil electrodes 42a and 42c, and the coil electrode layer 43 having the coil electrodes 43a and 43c (including the lead-out electrodes 43b and 43d), each of these electrodes being formed on an insulating layer, are stacked. The stack of these electrode layers spirally couples the coil electrodes with via holes disposed therebetween in the insulating layers and forms the coils L1, L2, L3, and L4, as shown in, e.g., FIG. 8.

The solid-color insulating layers 64 are stacked between the capacitor unit 60 and each of the coil units 30 and 40.

Although only their locations are illustrated in FIG. 7, the external electrodes 1pin in, 1pin out, 2pin in, 2pin out, 3pin in, 3pin out, 4pin in, and 4pin out are formed on surfaces of the above multilayer structure, as shown in, e.g., FIG. 8. The lead-out electrode 31b disposed at an end of the coil electrode 31a is coupled to the external electrode 2pin in. The lead-out electrode 31d disposed at an end of the coil electrode 31c is coupled to the external electrode 3pin in. The lead-out electrode 33b disposed at an end of the coil electrode 33a is coupled to the external electrode 2pin out. The lead-out electrode 33d disposed at an end of the coil electrode 33c is coupled to the external electrode 3pin out.

The lead-out electrode 41b disposed at an end of the coil electrode 41a is coupled to the external electrode 1pin out. The lead-out electrode 41d disposed at an end of the coil electrode 41c is coupled to the external electrode 4pin out. The lead-out electrode 43b disposed at an end of the coil electrode 43a is coupled to the external electrode 1pin in. The lead-out electrode 43d disposed at an end of the coil electrode 43c is coupled to the external electrode 4pin in.

The signal electrodes 62a and 63a are coupled to the external electrode 1pin out. The signal electrodes 62b and 63b are coupled to the external electrode 4pin out. The signal electrodes 62c and 63c are coupled to the external electrode 2pin out. The signal electrodes 62d and 63d are coupled to the external electrode 3pin out.

The above-described capacitor unit 60 and coil units 30 and 40 form the equivalent circuit illustrated in FIG. 8. The LC resonance circuits made up of L1 and C1, L2 and C2, L3 and C3, and L4 and C4 are formed between input and output external electrodes and function as a noise filter.

A noise circulating capacitance C33 is formed between the lead-out electrodes 31b and 31d. A noise circulating capacitance C34 is formed between the lead-out electrodes 43b and 43d. In this way, generation of the noise circulating capacitances C33 and C34 in the multilayer structure enables controlling noise reflection and reducing noise. Reflection characteristics and attenuation characteristics of the third embodiment are substantially the same as those of the second embodiment. In particular, with the third embodiment, capacity coupling occurs between lead-out electrodes, so magnetic flux of a coil is not largely disturbed and the L value of the coil can be set at a large value.

Figure 9:
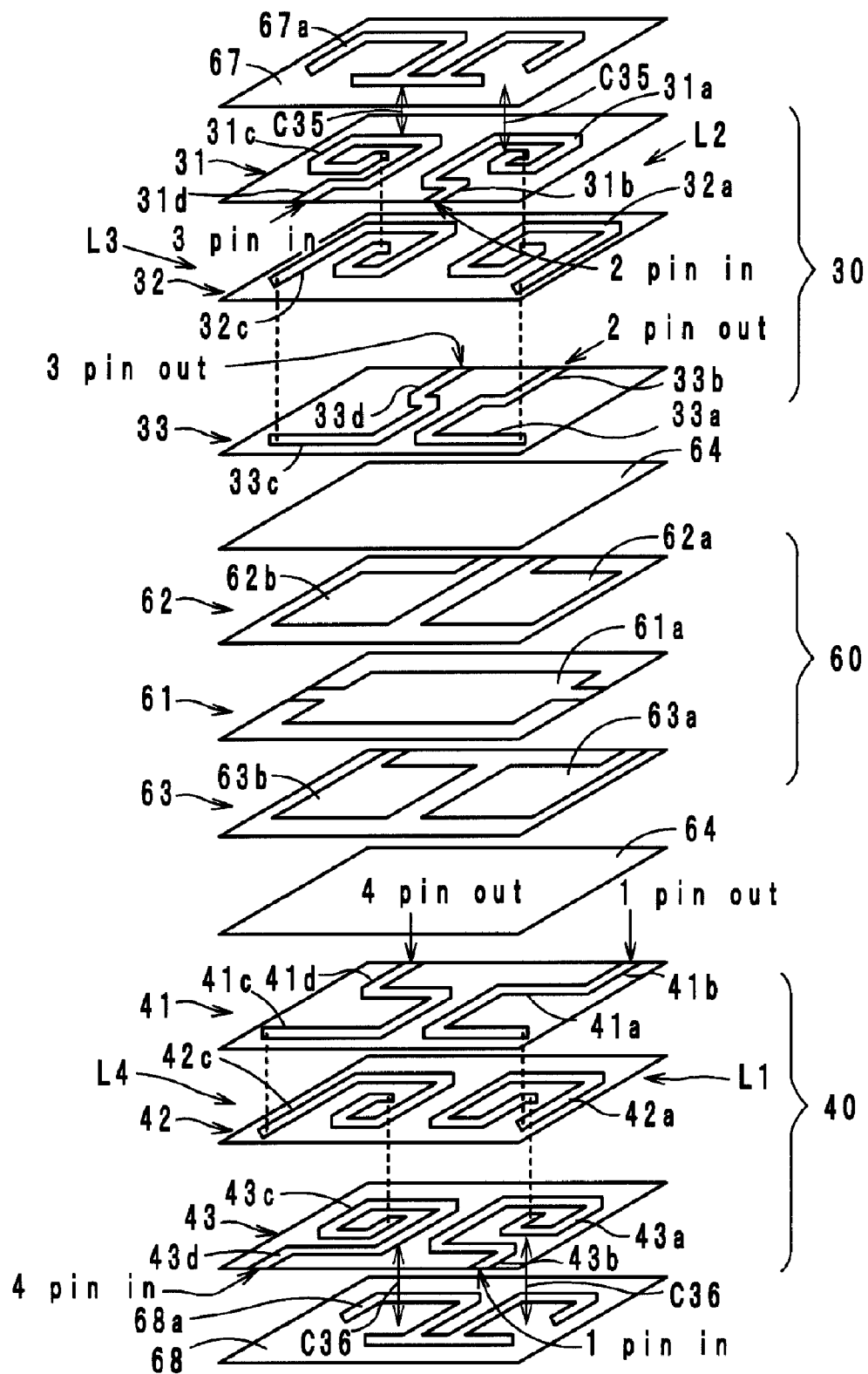
FIG. 9 is an exploded perspective view illustrating an LC composite electronic component according to a fourth embodiment.
Figure 10:
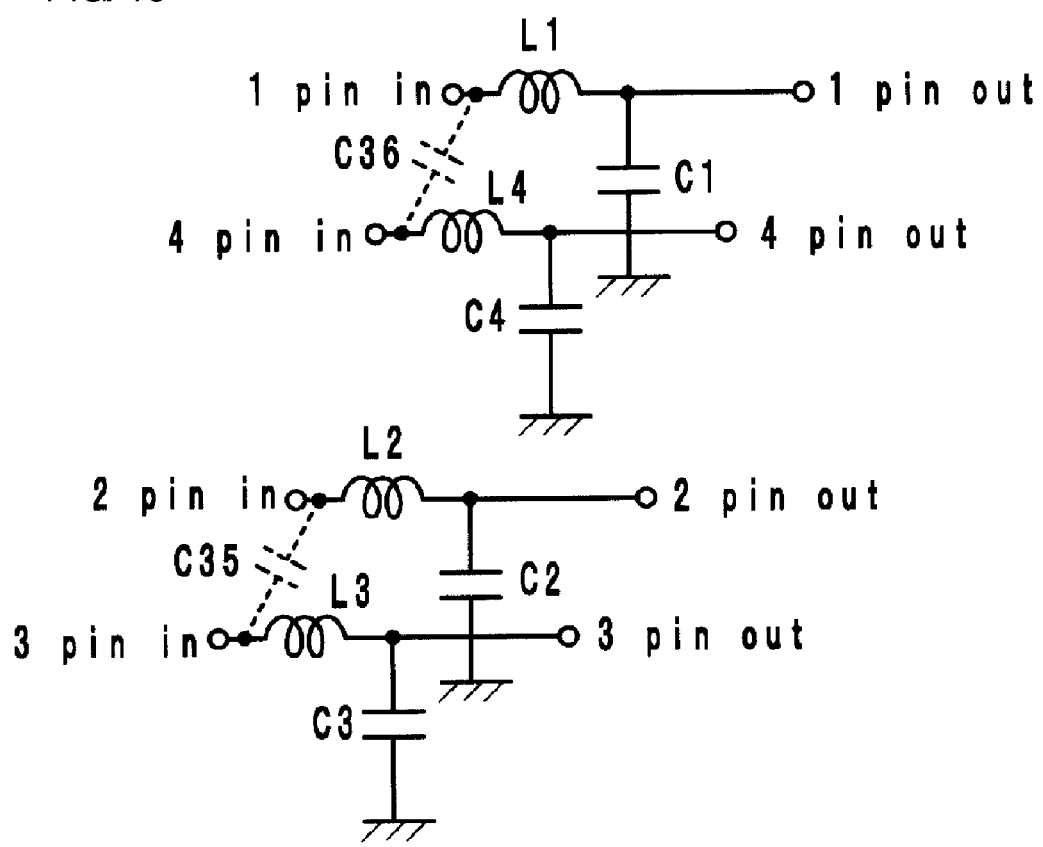
FIG. 10 is an equivalent circuit diagram of the fourth embodiment.

An exploded perspective view of an LC composite electronic component (noise filter array) according to a fourth embodiment is illustrated in FIG. 9, and its equivalent circuit diagram is illustrated in FIG. 10. This LC composite electronic component generally includes a multilayer structure in which the capacitor unit 60 and the first and second coil units 30 and 40 are stacked.

The configuration of each of the capacitor unit 60 and first and second coil units 30 and 40 is substantially the same as that described in the above second embodiment, as shown in, e.g., FIG. 4, and the detailed description thereof is not repeated here. An electrode layer having a noise circulating capacitance electrode 67a formed on an insulating layer 67 is stacked on the upper surface of the first coil unit 30. An electrode layer having a noise circulating capacitance electrode 68a formed on an insulating layer 68 is stacked on the lower surface of the second coil unit 40.

The present embodiment is also substantially the same as the above second embodiment in that the external electrodes 1pin in, 1pin out, 2pin in, 2pin out, 3pin in, 3pin out, 4pin in, and 4pin out are formed on surfaces of the multilayer structure, and also in respect of the coupling relationship between these external electrodes, the coil electrodes, and the signal electrodes. As illustrated in the equivalent circuit of FIG. 10, the LC resonance circuits made up of L1 and C1, L2 and C2, L3 and C3, and L4 and C4 are formed between input and output external electrodes and function as a noise filter.

For the fourth embodiment, the noise circulating capacitance electrodes 67a and 68a have substantially the same planar shape as that of each of the coils L1, L2, L3, and L4. A noise circulating capacitance C35 is formed between the noise circulating capacitance electrode 67a and each of the coil electrodes 31a and 31c. A noise circulating capacitance C36 is formed between the noise circulating capacitance electrode 68a and each of the coil electrodes 43a and 43c. In this way, generation of the noise circulating capacitances C35 and C36 in the multilayer structure enables controlling noise reflection and reducing noise.

Figure 11:
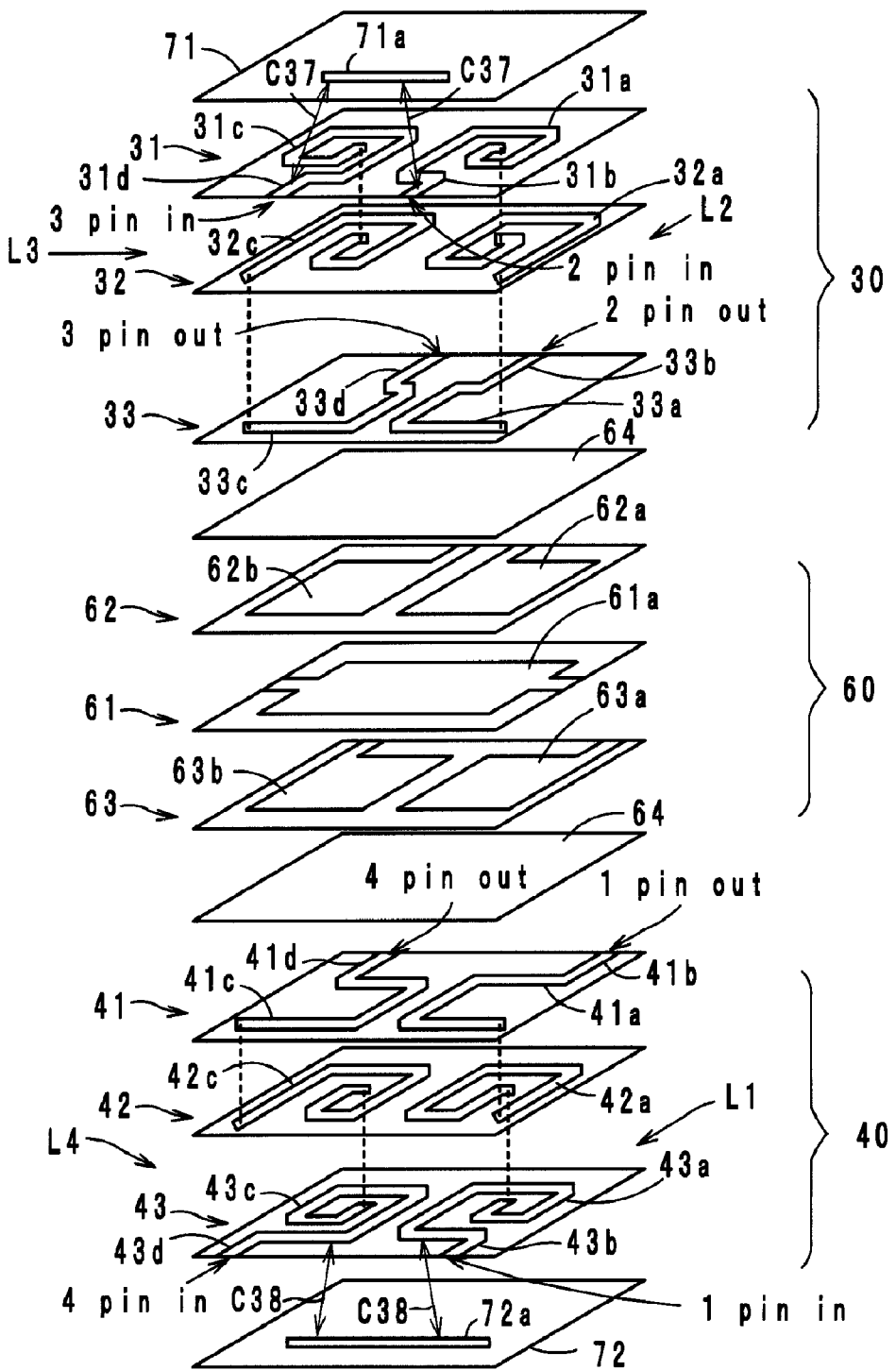
FIG. 11 is an exploded perspective view illustrating an LC composite electronic component according to a fifth embodiment.
Figure 12:
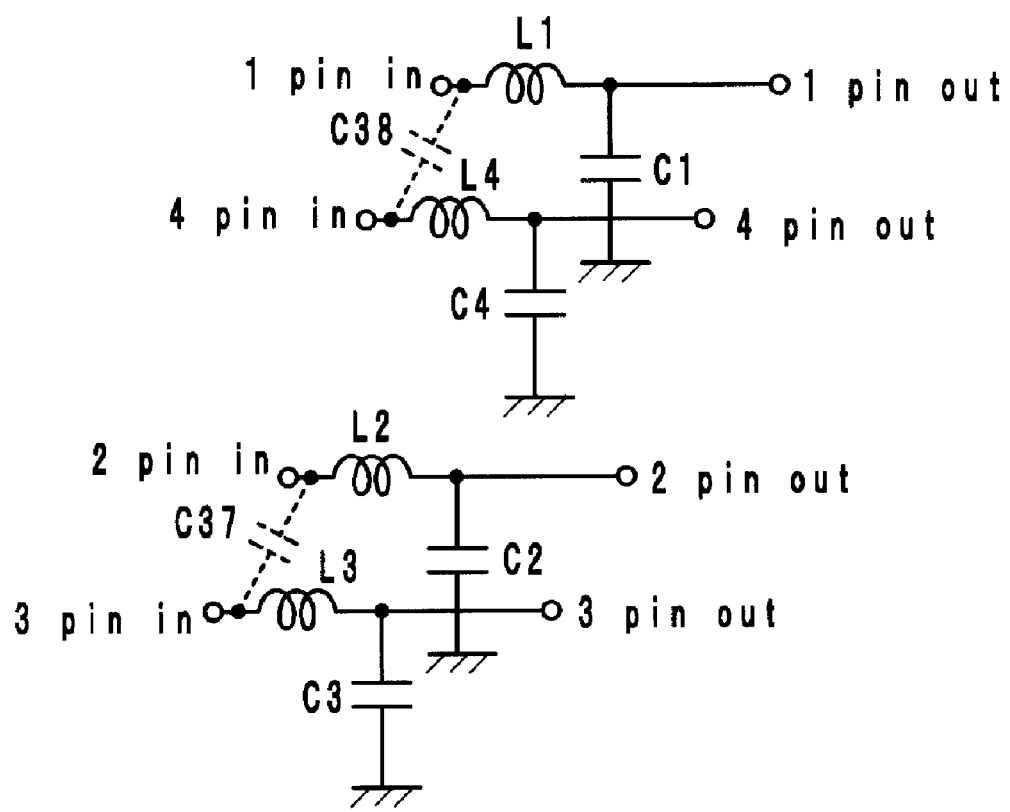
FIG. 12 is an equivalent circuit diagram of the fifth embodiment.

An exploded perspective view of an LC composite electronic component (noise filter array) according to a fifth embodiment is illustrated in FIG. 11, and its equivalent circuit diagram is illustrated in FIG. 12. This LC composite electronic component generally includes a multilayer structure in which the capacitor unit 60 and the first and second coil units 30 and 40 are stacked.

The configuration of each of the capacitor unit 60 and first and second coil units 30 and 40 is substantially the same as that described in the above second embodiment shown in FIG. 4, and the detailed description thereof is not repeated here. An electrode layer having a noise circulating capacitance electrode 71a formed on an insulating layer 71 is stacked on the upper surface of the first coil unit 30. An electrode layer having a noise circulating capacitance electrode 72a formed on an insulating layer 72 is stacked on the lower surface of the second coil unit 40.

The present embodiment is also substantially the same as the above second embodiment in that the external electrodes 1pin in, 1pin out, 2pin in, 2pin out, 3pin in, 3pin out, 4pin in, and 4pin out are formed on surfaces of the multilayer structure, and also in respect of the coupling relationship between these external electrodes, the coil electrodes, and the signal electrodes. As illustrated in the equivalent circuit of FIG. 12, the LC resonance circuits made up of L1 and C1, L2 and C2, L3 and C3, and L4 and C4 are formed between input and output external electrodes and function as a noise filter.

For the fifth embodiment, the noise circulating capacitance electrode 71a faces the lead-out electrodes 31b and 31d disposed at ends of the coil electrodes 31a and 31c, respectively, and the noise circulating capacitance electrode 72a faces the lead-out electrodes 43b and 43b disposed at ends of the coil electrodes 43a and 43c, respectively. Accordingly, a noise circulating capacitance C37 is formed between the noise circulating capacitance electrode 71a and each of the lead-out electrodes 31b and 31d, and a noise circulating capacitance C38 is formed between the noise circulating capacitance electrode 72a and each of the lead-out electrodes 43b and 43d. In this way, generation of the noise circulating capacitances C37 and C38 in the multilayer structure enables controlling noise reflection and reducing noise.

Figure 13:
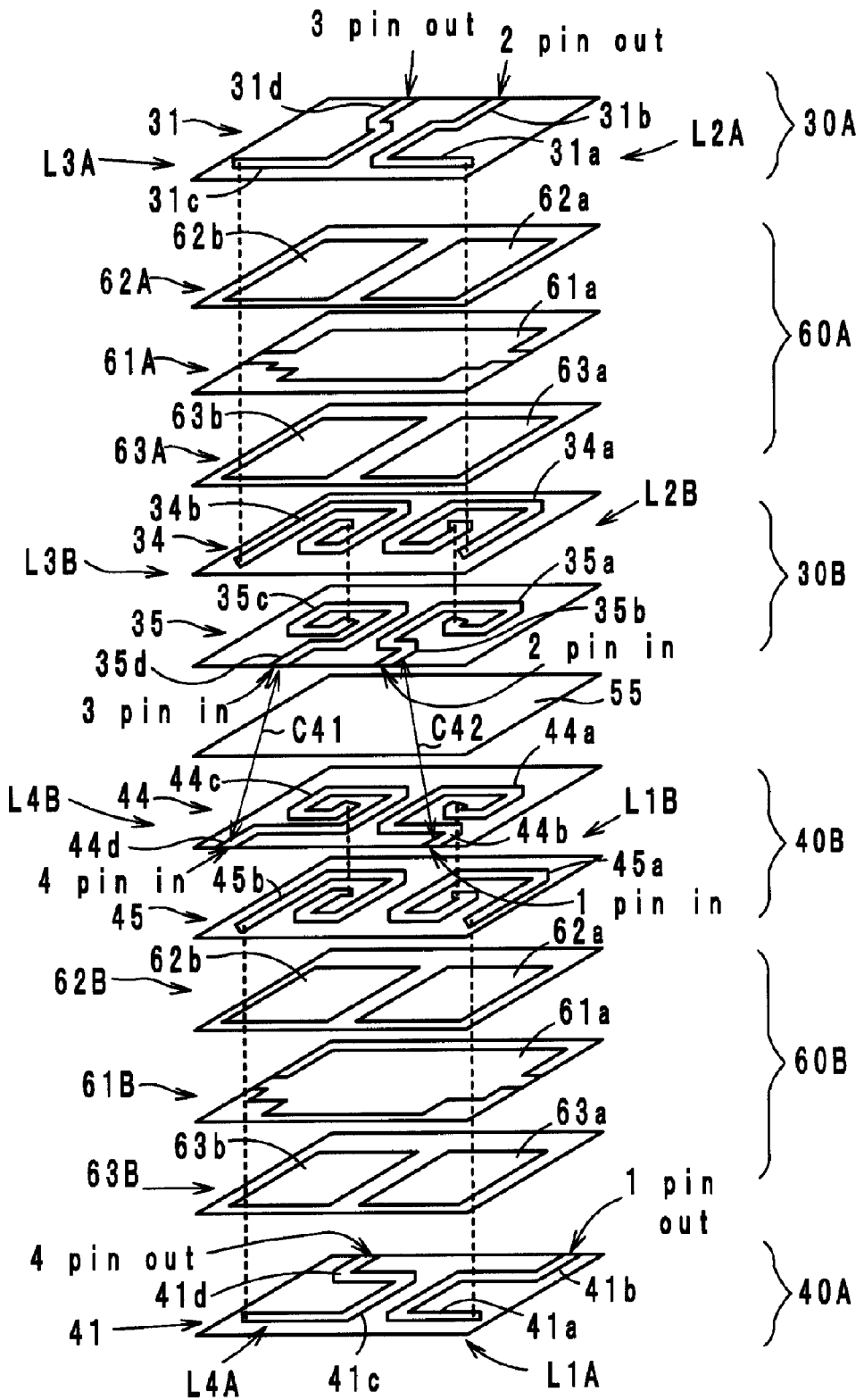
FIG. 13 is an exploded perspective view illustrating an LC composite electronic component according to a sixth embodiment.
Figure 14:
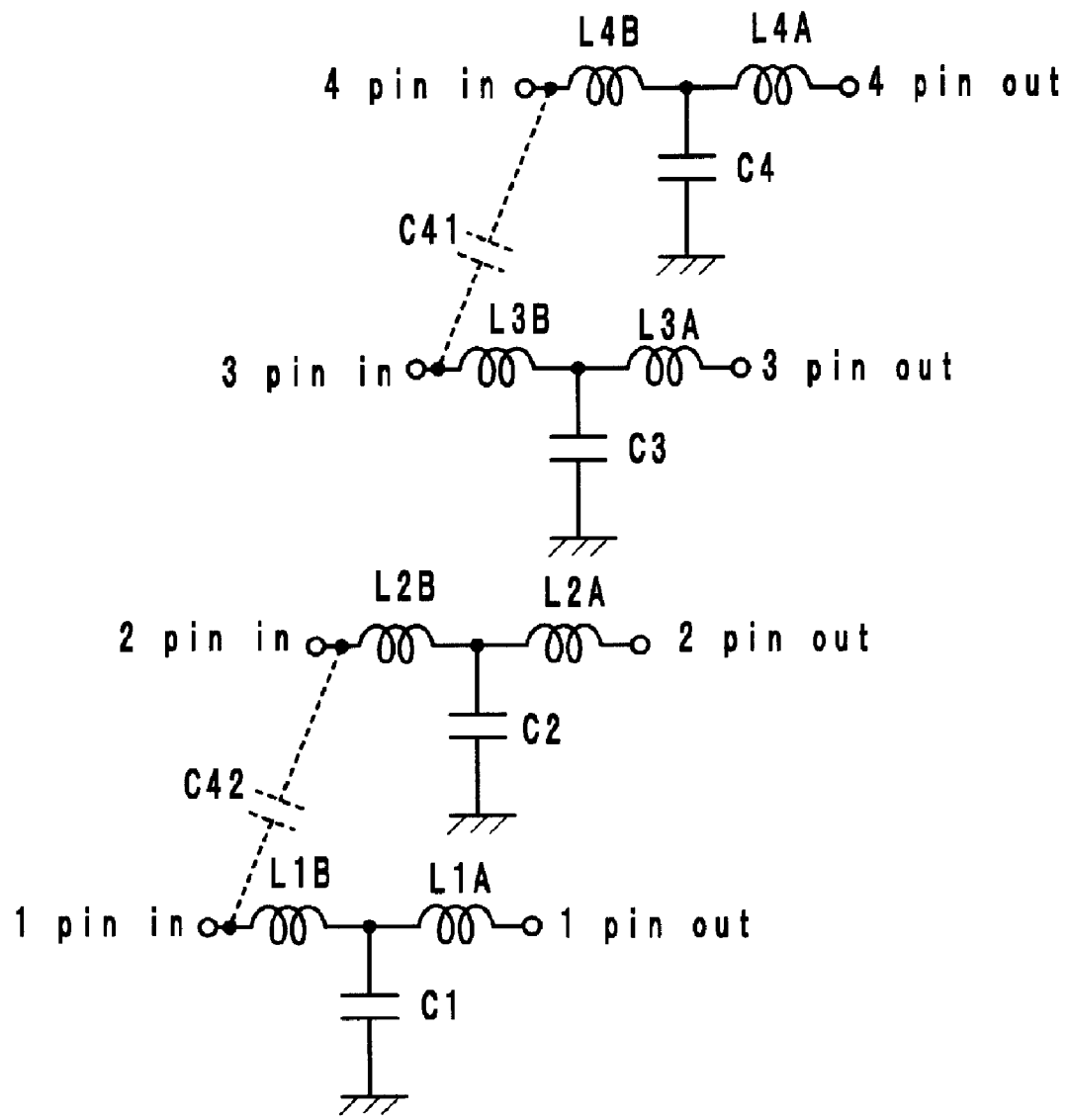
FIG. 14 is an equivalent circuit diagram of the sixth embodiment.

An exploded perspective view of an LC composite electronic component (noise filter array) according to a sixth embodiment is illustrated in FIG. 13, and its equivalent circuit diagram is illustrated in FIG. 14. This LC composite electronic component generally includes a multilayer structure in which capacitor units 60A and 60B, first coil units 30A and 30B, and second coil units 40A and 40B are stacked.

The capacitor unit 60A is the one in which a ground electrode layer 61A having the ground electrode 61a, a signal electrode layer 62A having the signal electrodes 62a and 62b, and a signal electrode layer 63A having the signal electrodes 63a and 63b, each of these electrodes being formed on an insulating layer, are stacked. The capacitor unit 60B is the one in which a ground electrode layer 61B having the ground electrode 61a, a signal electrode layer 62B having the signal electrodes 62a and 62b, and a signal electrode layer 63B having the signal electrodes 63a and 63b, each of these electrodes being formed on an insulating layer, are stacked. The stack of these electrode layers forms the capacitors C1, C2, C3, and C4, as shown in, e.g., FIG. 14.

The coil unit 30A includes the coil electrode layer 31 having the coil electrodes 31a and 31c (including the lead-out electrodes 31b and 31d) formed on an insulating layer. The coil unit 30B is the one in which a coil electrode layer 34 having coil electrodes 34a and 34c, and a coil electrode layer 35 having coil electrodes 35a and 35c (including lead-out electrodes 35b and 35d), each of these electrodes being formed on an insulating layer, are stacked. The coil unit 40A includes the coil electrode layer 41 having the coil electrodes 41a and 41c (including the lead-out electrodes 41b and 41d) formed on an insulating layer. The coil unit 40B is the one in which a coil electrode layer 44 having coil electrodes 44a and 44c (including lead-out electrodes 44b and 44d) and a coil electrode layer 45 having coil electrodes 45a and 45c, each of these electrodes being formed on an insulating layer, are stacked.

The stack of these electrode layers spirally couples the coil electrodes with via holes disposed therebetween in the insulating layers and forms coils L1A, L1B, L2A, L2B, L3A, L3B, L4A, and L4B (see FIG. 14). In particular, the coil electrodes 31a and 34a and the coil electrodes 31c and 34b are coupled together so as to pass thorough the electrode layers 61A, 62A, and 63A. The coil electrodes 45a and 41a and the coil electrodes 45b and 41c are coupled together so as to pass through the electrode layers 61B, 62B, and 63B. The solid-color insulating layer 55 is stacked between the coil unit 30B and the coil unit 40B.

Although only their locations are illustrated in FIG. 13, external electrodes 1pin in, 1pin out, 2pin in, 2pin out, 3pin in, 3pin out, 4pin in, and 4pin out are formed on surfaces of the above multilayer structure, as shown in, e.g., FIG. 14. The lead-out electrode 31b disposed at an end of the coil electrode 31a is coupled to the external electrode 2pin out. The lead-out electrode 31d disposed at an end of the coil electrode 31c is coupled to the external electrode 3pin out. The lead-out electrode 35b disposed at an end of the coil electrode 35a is coupled to the external electrode 2pin in. The lead-out electrode 35d disposed at an end of the coil electrode 35c is coupled to the external electrode 3pin in.

The lead-out electrode 44b disposed at an end of the coil electrode 44a is coupled to the external electrode 1pin in. The lead-out electrode 44d disposed at an end of the coil electrode 44c is coupled to the external electrode 4pin in. The lead-out electrode 41b disposed at an end of the coil electrode 41a is coupled to the external electrode 1pin out. The lead-out electrode 41d disposed at an end of the coil electrode 41c is coupled to the external electrode 4pin out.

The signal electrodes 62a and 63a of the electrode layers 62A and 63A are coupled to the coil electrodes 31a and 34a, and the signal electrodes 62b and 63b are coupled to the coil electrodes 31c and 34b. The signal electrodes 62a and 63a of the electrode layers 62B and 63B are coupled to the coil electrodes 45a and 41a, and the signal electrodes 62b and 63b are coupled to the coil electrodes 45b and 41c.

The above capacitor units 60A and 60B and the coil units 30A, 30B, 40A, and 40B form the equivalent circuit illustrated in FIG. 14. LC resonance circuits made up of L1A, L1B, and C1, L2A, L2B, and C2, L3A, L3B, and C3, and L4A, L4B, and C4 are formed between input and output external electrodes and function as a noise filter.

A noise circulating capacitance C41 is formed between the lead-out electrodes 35d and 44d, and a noise circulating capacitance C42 is formed between the lead-out electrodes 35b and 44b. In this way, generation of the noise circulating capacitances C41 and C42 in the multilayer structure enables controlling noise reflection and reducing noise.

Figure 15:
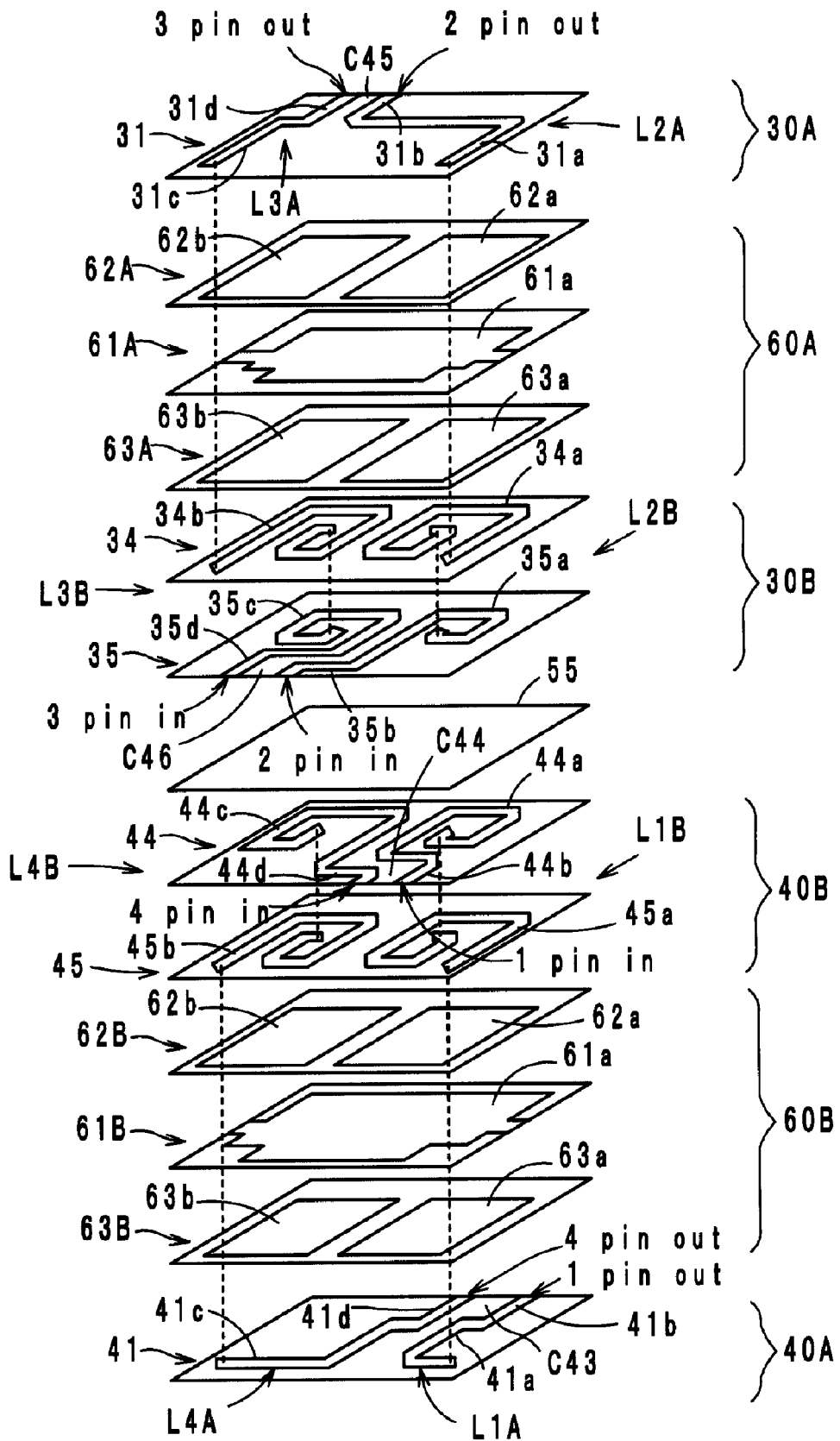
FIG. 15 is an exploded perspective view illustrating an LC composite electronic component according to a seventh embodiment.
Figure 16:
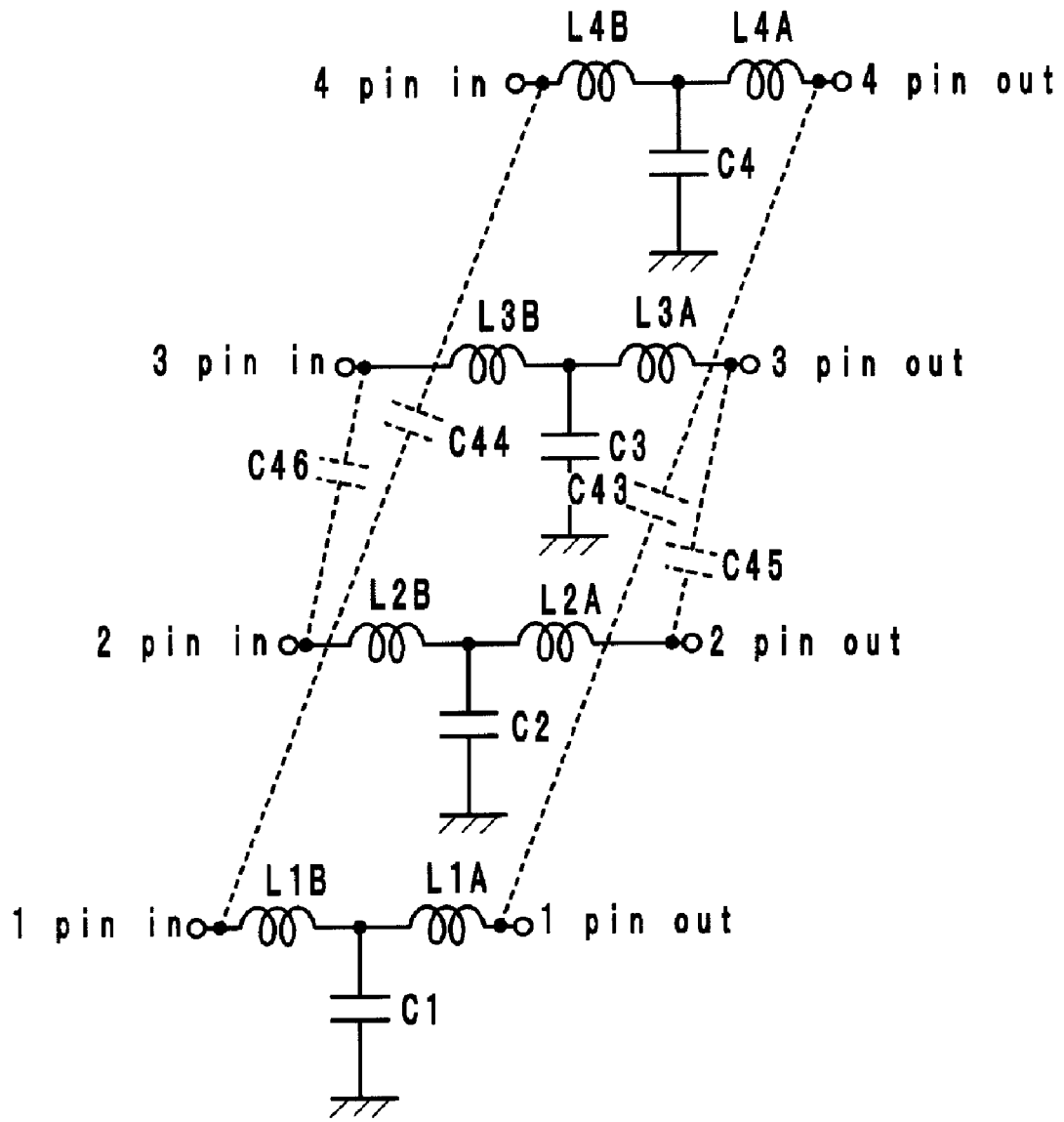
FIG. 16 is an equivalent circuit diagram of the seventh embodiment.

An exploded perspective view of an LC composite electronic component (noise filter array) according to a seventh embodiment is illustrated in FIG. 15, and its equivalent circuit diagram is illustrated in FIG. 16. This LC composite electronic component generally includes a multilayer structure in which the capacitor units 60A and 60B, the first coil units 30A and 30B, and the second coil units 40A and 40B are stacked.

The configuration of each of the capacitor units 60A and 60B and the coil units 30A, 30B, 40A, and 40B is substantially the same as that described in the above sixth embodiment (see FIG. 13), and the detailed description thereof is not repeated here. The present embodiment is also substantially the same as in the above sixth embodiment in that the external electrodes 1pin in, 1pin out, 2pin in, 2pin out, 3pin in, 3pin out, 4pin in, and 4pin out are formed on surfaces of the multilayer structure, and also in respect of the coupling relationship between these external electrodes, the coil electrodes, and the signal electrodes. It is to be noted that the lead-out electrodes 31b and 31d disposed at ends of the coil electrodes 31a and 31c are adjacent to each other, the lead-out electrodes 35b and 35d disposed at ends of the coil electrodes 35a and 35c are adjacent to each other, the lead-out electrodes 44b and 44d disposed at ends of the coil electrodes 44a and 44c are adjacent to each other, and the lead-out electrodes 41b and 41d disposed at ends of the coil electrodes 41a and 41c are adjacent to each other.

The signal electrodes 62a and 63a of the electrode layers 62A and 63A are coupled to the coil electrodes 31a and 34a, and the signal electrodes 62b and 63b are coupled to the coil electrodes 31c and 34b. The signal electrodes 62a and 63a of the electrode layers 62B and 63B are coupled to the coil electrodes 45a and 41a, and the signal electrodes 62b and 63b are coupled to the coil electrodes 45b and 41c.

The above capacitor units 60A and 60B and the coil units 30A, 30B, 40A, and 40B form the equivalent circuit illustrated in FIG. 16. The LC resonance circuits made up of L1A, L1B, and C1, L2A, L2B, and C2, L3A, L3B, and C3, and L4A, L4B, and C4 are formed between input and output external electrodes and function as a noise filter.

A noise circulating capacitance C43 is formed between the lead-out electrodes 41b and 41d, and a noise circulating capacitance C44 is formed between the lead-out electrodes 44b and 44d. A noise circulating capacitance C45 is formed between the lead-out electrodes 31b and 31d, and a noise circulating capacitance C46 is formed between the lead-out electrodes 35b and 35d. In this way, generation of the noise circulating capacitances C43 to C46 in the multilayer structure enables controlling noise reflection and reducing noise.

Figure 17:
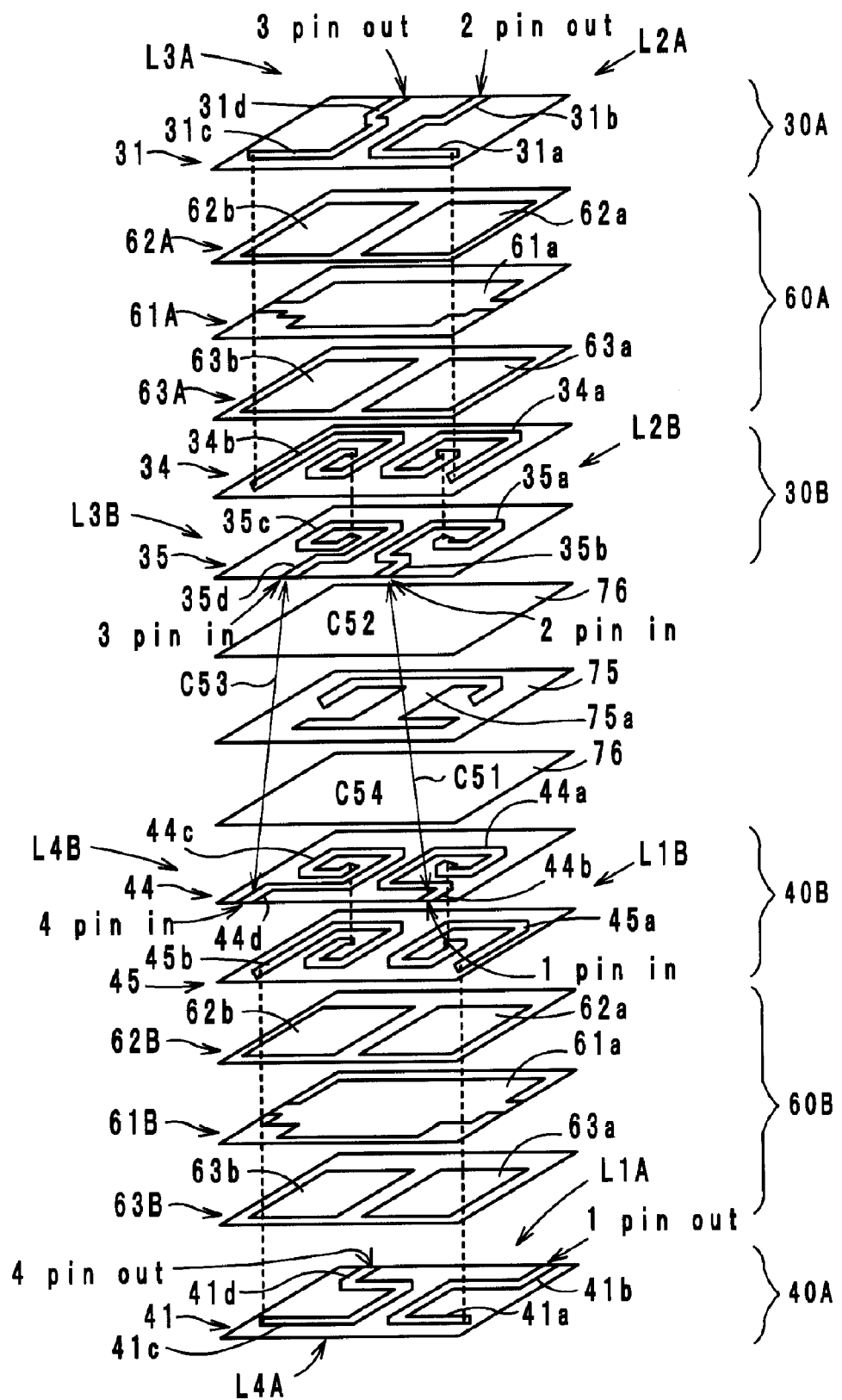
FIG. 17 is an exploded perspective view illustrating an LC composite electronic component according to an eighth embodiment.
Figure 18:
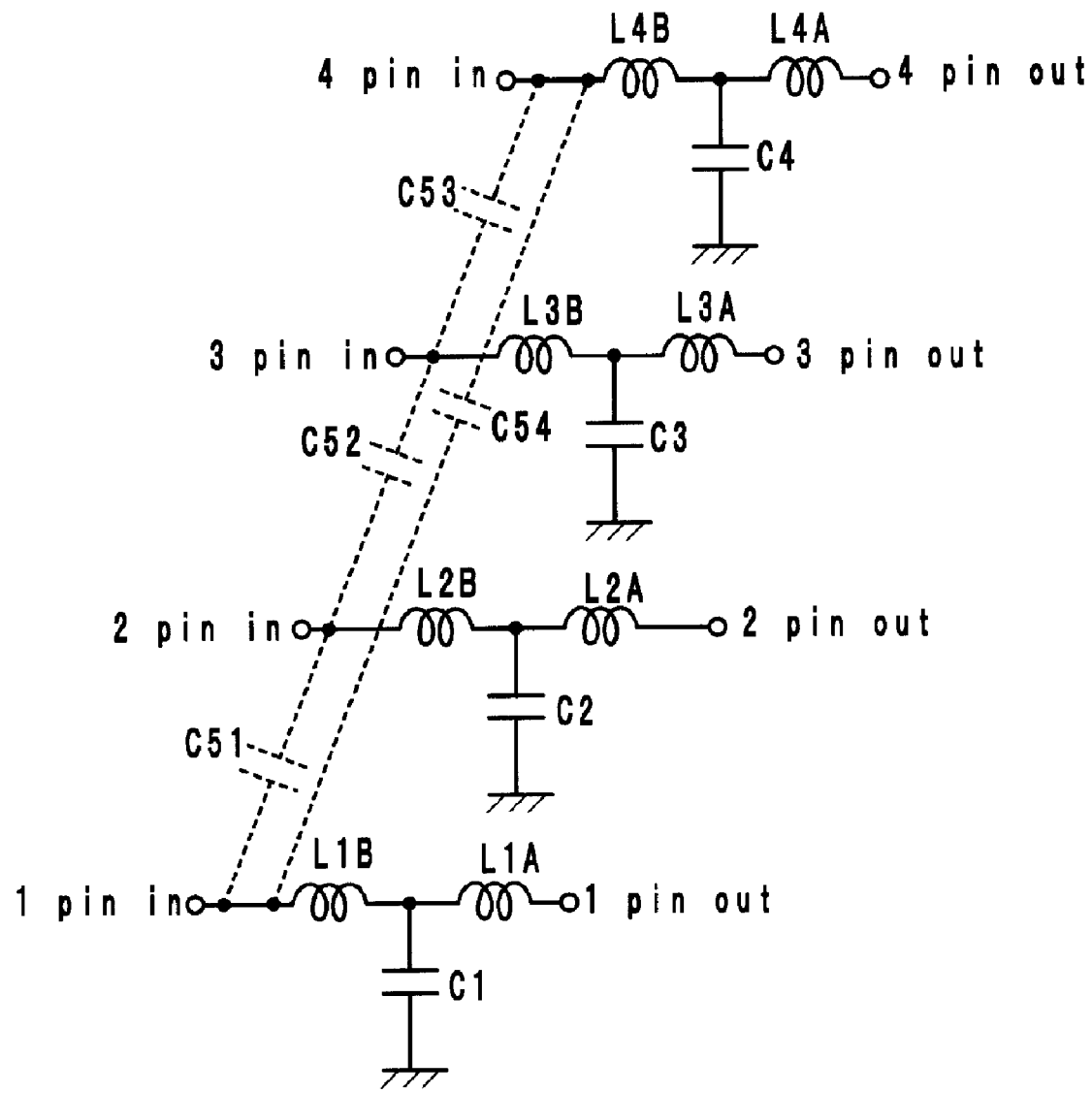
FIG. 18 is an equivalent circuit diagram of the eighth embodiment.

An exploded perspective view of an LC composite electronic component (noise filter array) according to an eighth embodiment is illustrated in FIG. 17, and its equivalent circuit diagram is illustrated in FIG. 18. This LC composite electronic component generally includes a multilayer structure in which the capacitor units 60A and 60B, the first coil units 30A and 30B, and the second coil units 40A and 40B are stacked.

An electrode layer having a noise circulating capacitance electrode 75a formed on an insulating layer 75 and solid-color insulating layers 76 are stacked between the coil units L2B and L1B. The noise circulating capacitance electrode 75a has a shape substantially corresponding to the coil electrodes 35a, 35c, 44a, and 44c.

The configuration of each of the capacitor units 60A and 60B and the coil units 30A, 30B, 40A, and 40B is substantially the same as that described in the above sixth embodiment (see FIG. 13), and the detailed description thereof is not repeated here. The present embodiment is also substantially the same as the above sixth embodiment in that the external electrodes 1pin in, 1pin out, 2pin in, 2pin out, 3pin in, 3pin out, 4pin in, and 4pin out are formed on surfaces of the multilayer structure, and also in respect of the coupling relationship between these external electrodes, the coil electrodes, and the signal electrodes.

The above capacitor units 60A and 60B and the coil units 30A, 30B, 40A, and 40B form the equivalent circuit illustrated in FIG. 18. The LC resonance circuits made up of L1A, L1B, and C1, L2A, L2B, and C2, L3A, L3B, and C3, and L4A, L4B, and C4 are formed between input and output external electrodes and function as a noise filter.

A noise circulating capacitance C51 is formed between the lead-out electrodes 35*b* and 44*b*, and a noise circulating capacitance C52 is formed in the vicinity of the noise circulating capacitance electrode 75*a* including the coil electrodes 35*a* and 35*c*. A noise circulating capacitance C53 is formed between the lead-out electrodes 35*d* and 44*d*, and a noise circulating capacitance C54 is formed in the vicinity of the noise circulating capacitance electrode 75*a* including the coil electrodes 44*a* and 44*c*. In this way, generation of the noise circulating capacitances C51 to C54 in the multilayer structure enables controlling noise reflection and reducing noise.

Figure 19:
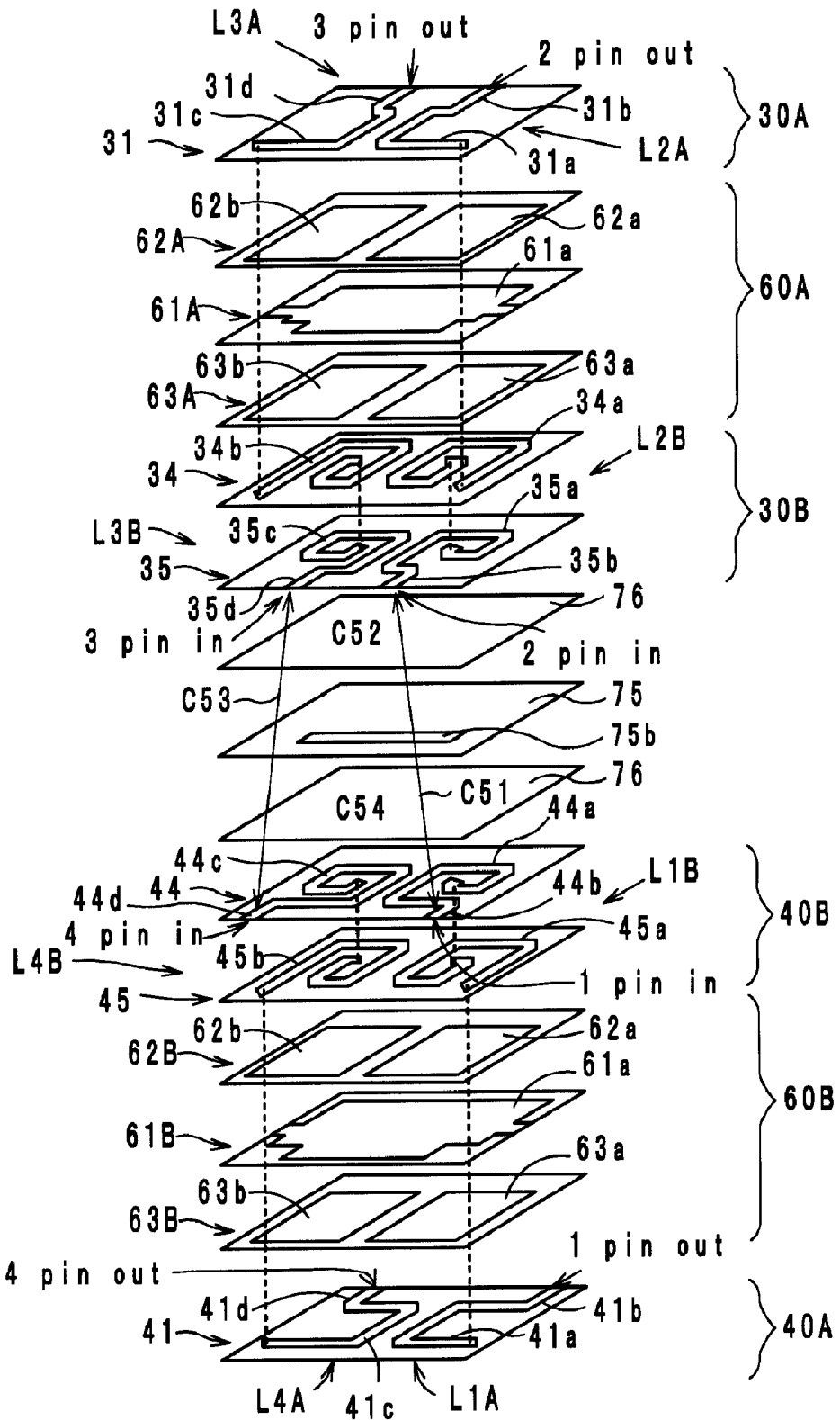
FIG. 19 is an exploded perspective view illustrating an LC composite electronic component according to a ninth embodiment.
Figure 20:
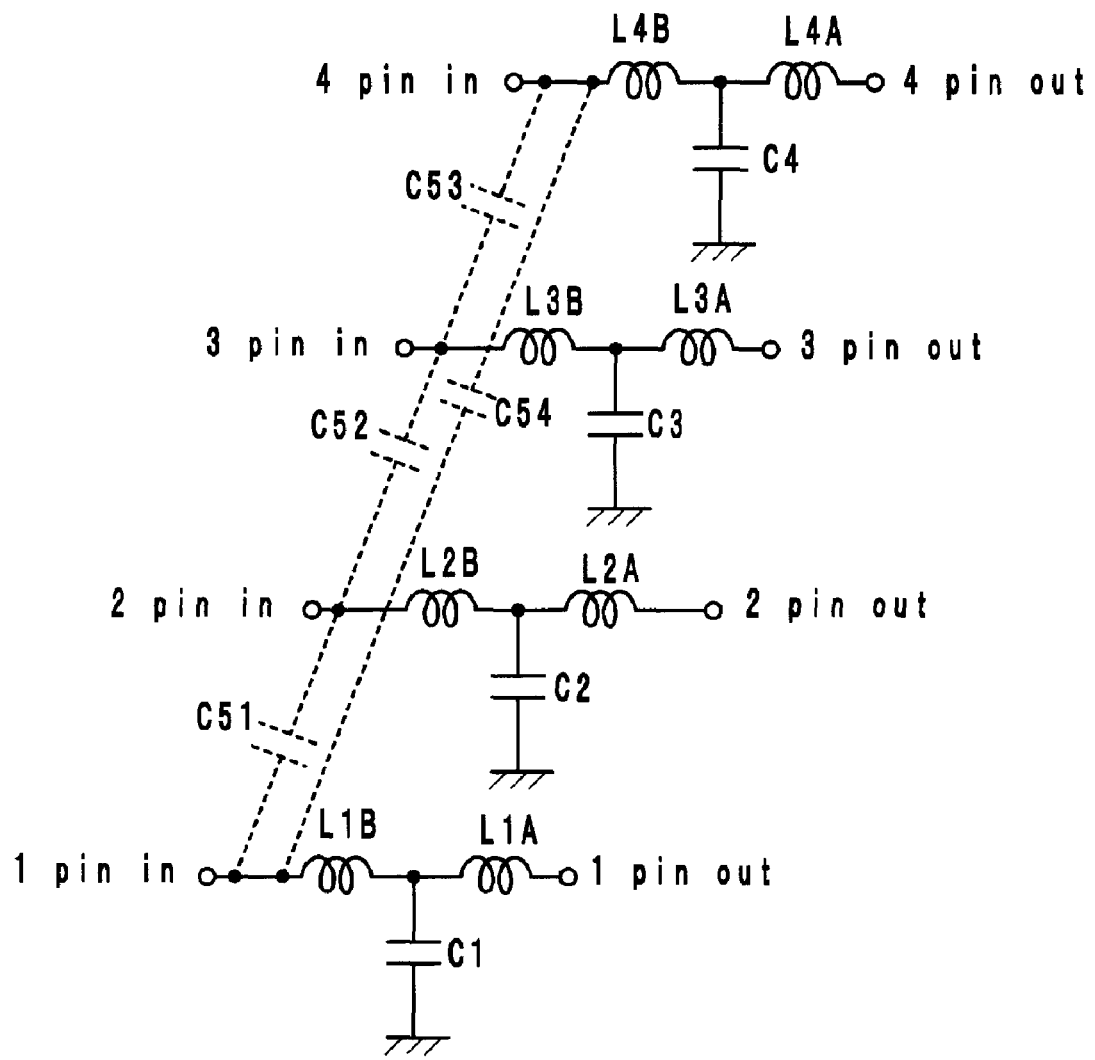
FIG. 20 is an equivalent circuit diagram of the ninth embodiment.

An exploded perspective view of an LC composite electronic component (noise filter array) according to a ninth embodiment is illustrated in FIG. 19, and its equivalent circuit diagram is illustrated in FIG. 20. This LC composite electronic component generally includes a multilayer structure in which the capacitor units 60A and 60B, the first coil units 30A and 30B, and the second coil units 40A and 40B are stacked.

An electrode layer having a noise circulating capacitance electrode 75*b* formed on the insulating layer 75 and the solid-color insulating layers 76 are stacked between the coil units L2B and L1B. The noise circulating capacitance electrode 75*b* has a shape substantially corresponding to the coil electrodes 35*b*, 35*d*, 44*b*, and 44*d*.

The configuration of each of the capacitor units 60A and 60B and the coil units 30A, 30B, 40A, and 40B is substantially the same as that described in the above sixth embodiment (see FIG. 13), and the detailed description thereof is not repeated here. The present embodiment is also substantially the same as the above sixth embodiment in that the external electrodes 1pin in, 1pin out, 2pin in, 2pin out, 3pin in, 3pin out, 4pin in, and 4pin out are formed on surfaces of the multilayer structure, and also in respect of the coupling relationship between these external electrodes, the coil electrodes, and the signal electrodes.

The above capacitor units 60A and 60B and the coil units 30A, 30B, 40A, and 40B form the equivalent circuit illustrated in FIG. 20. The LC resonance circuits made up of L1A, L1B, and C1, L2A, L2B, and C2, L3A, L3B, and C3, and L4A, L4B, and C4 are formed between input and output external electrodes and function as a noise filter.

The noise circulating capacitance C51 is formed between the lead-out electrodes 35*b* and 44*b*, and the noise circulating capacitance C52 is formed in the vicinity of the noise circulating capacitance electrode 75*b* including the lead-out electrodes 35*b* and 35*d*. The noise circulating capacitance C53 is formed between the lead-out electrodes 35*d* and 44*d*, and the noise circulating capacitance C54 is formed in the vicinity of the noise circulating capacitance electrode 75*b* including the lead-out electrodes 44*b* and 44*d*. In this way, generation of the noise circulating capacitances C51 to C54 in the multilayer structure enables controlling noise reflection and reducing noise.

Figure 21:
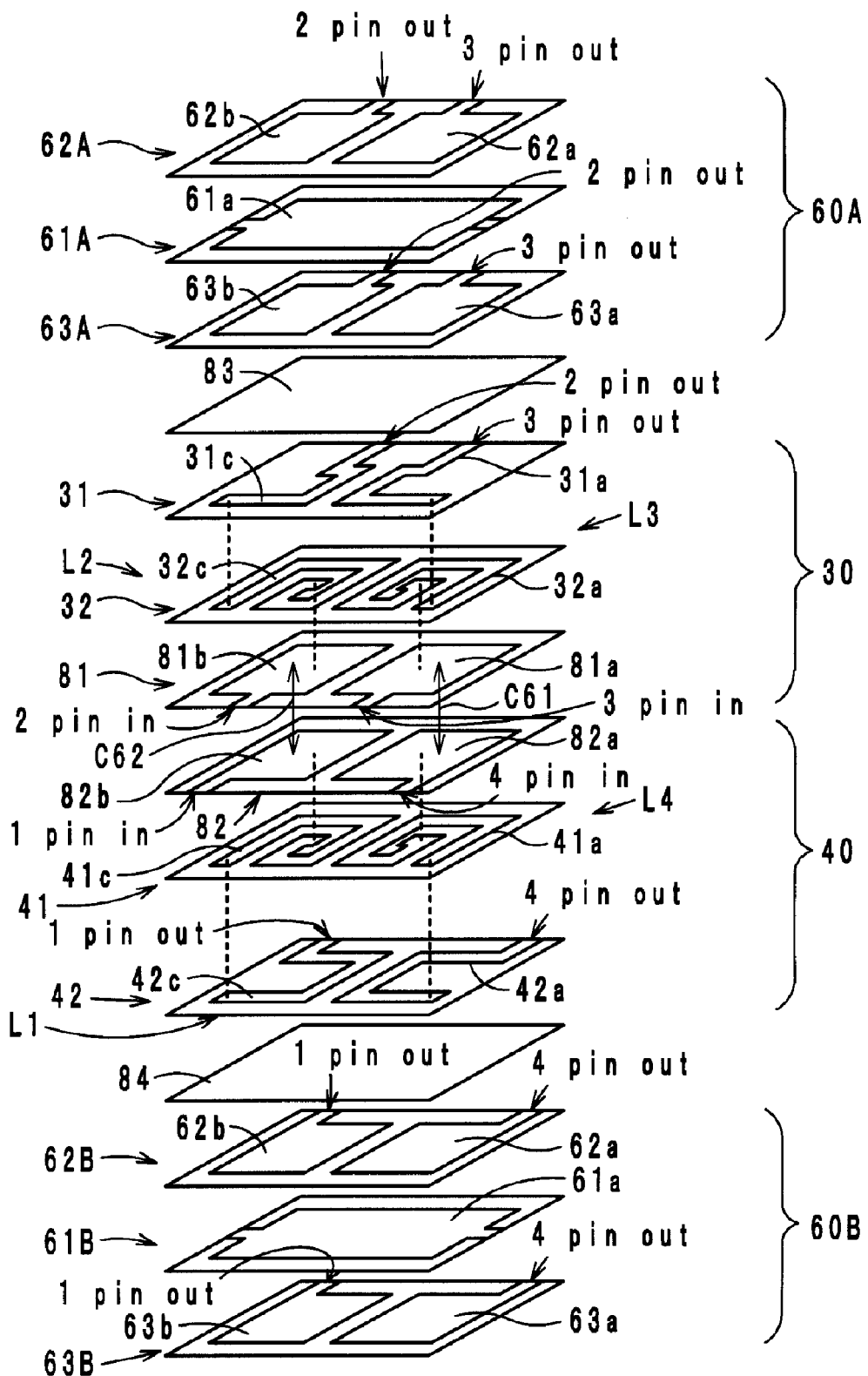
FIG. 21 is an exploded perspective view illustrating an LC composite electronic component according to a 10th embodiment.
Figure 22:
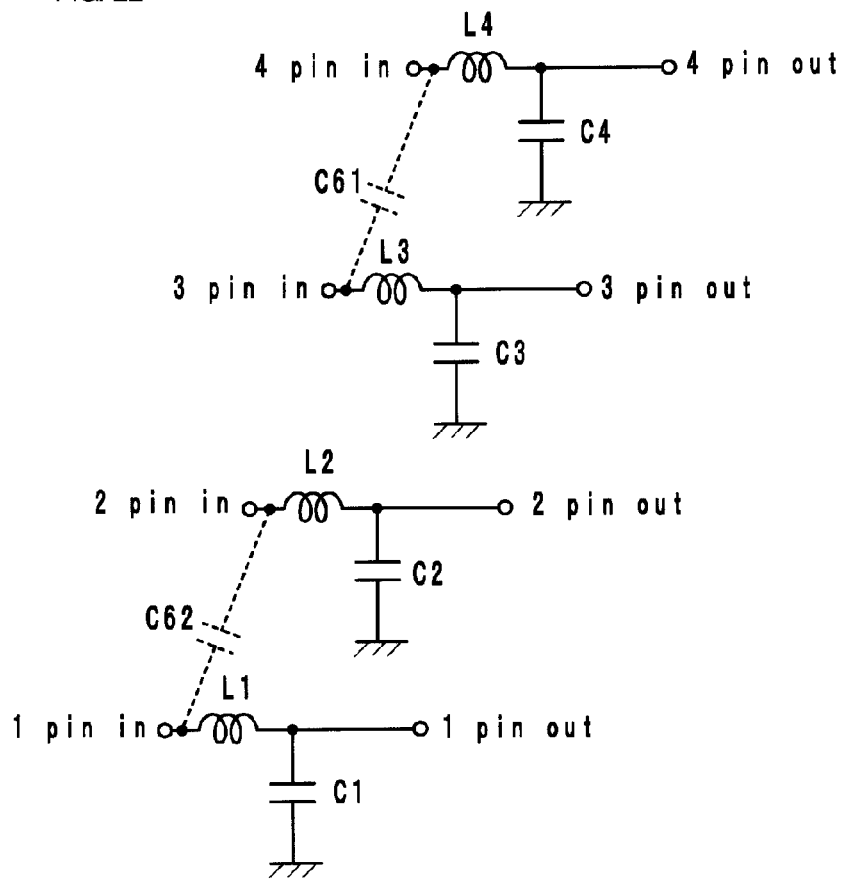
FIG. 22 is an equivalent circuit diagram of the 10th embodiment.

An exploded perspective view of an LC composite electronic component (noise filter array) according to a tenth embodiment is illustrated in FIG. 21, and its equivalent circuit diagram is illustrated in FIG. 22. This LC composite electronic component is the one in which the coil units 30A and 40A (coils L1A, L2A, L3A, and L4*a*) of the above sixth embodiment shown in FIGS. 13 and 14 are omitted and generally includes a multilayer structure in which the capacitor units 60A and 60B and the coil units 30 and 40 are stacked.

The capacitor unit 60A is the one in which the ground electrode layer 61A having the ground electrode 61*a*, the signal electrode layer 62A having the signal electrodes 62*a* and 62*b*, and the signal electrode layer 63A having the signal electrodes 63*a* and 63*b*, each of these electrodes being formed on an insulating layer, are stacked. The capacitor unit 60B is the one in which the ground electrode layer 61B having the ground electrode 61*a*, the signal electrode layer 62B having the signal electrodes 62*a* and 62*b*, and the signal electrode layer 63B having the signal electrodes 63*a* and 63*b*, each of these electrodes being formed on an insulating layer, are stacked. The stack of these electrode layers forms the capacitors C1, C2, C3, and C4, as shown in FIG. 22.

The coil unit 30 is the one in which the coil electrode layer 31 having the coil electrodes 31*a* and 31*c*, the coil electrode layer 32 having the coil electrodes 32*a* and 32*c*, each of these electrodes being formed on an insulating layer, and an insulating layer 81 with wide lead-out electrodes 81*a* and 81*b* being formed are stacked. The coil unit 40 is the one in which the coil electrode layer 41 having the coil electrodes 41*a* and 41*c*, the coil electrode layer 42 having the coil electrodes 42*a* and 42*c*, each of these electrodes being formed on an insulating layer, and an insulating layer 82 with wide lead-out electrodes 82*a* and 82*b* being formed are stacked.

The stack of these electrode layers spirally couples the coil electrodes with via holes disposed therebetween in the insulating layers and forms the coils L1, L2, L3, and L4 (see FIG. 22). A first end of the coil electrode 32*a* is coupled to the lead-out electrode 81*a* with a via hole disposed therebetween, and a first end of the coil electrode 32*c* is coupled to the lead-out electrode 81*b* with a via hole disposed therebetween. A first end of the coil electrode 41*a* is coupled to the lead-out electrode 82*a* with a via hole disposed therebetween, and a first end of the coil electrode 41*c* is coupled to the lead-out electrode 82*b* with a via hole disposed therebetween. A solid-color insulating layer 83 is stacked between the coil unit 30 and the capacitor unit 60A, and a solid-color insulating layer 84 is stacked between the coil unit 40 and the capacitor unit 60B.

Although only their locations are illustrated in FIG. 21, the external electrodes 1pin in, 1pin out, 2pin in, 2pin out, 3pin in, 3pin out, 4pin in, and 4pin out are formed on surfaces of the above multilayer structure, such as shown in FIG. 22. An end of the coil electrode 31*a* and the signal electrodes 62*a* and 63*a* on the signal electrode layers 62A and 63A are coupled to the external electrode 3pin out. An end of the coil electrode 31*c* and the signal electrodes 62*b* and 63*b* on the signal electrode layers 62A and 63A are coupled to the external electrode 2pin out. An end of the coil electrode 42*a* and the signal electrodes 62*a* and 63*a* on the signal electrode layers 62B and 63B are coupled to the external electrode 4pin out. An end of the coil electrode 42*c* and the signal electrodes 62*b* and 63*b* on the signal electrode layers 62B and 63B are coupled to the external electrode 1pin out.

The lead-out electrode 81*a* coupled to an end of the coil electrode 32*a* is coupled to the external electrode 3pin in, and the lead-out electrode 81*b* coupled to an end of the coil electrode 32*c* is coupled to the external electrode 2pin in. The lead-out electrode 82*a* coupled to an end of the coil electrode 41*a* is coupled to the external electrode 4pin in, and the lead-out electrode 82b coupled to an end of the coil electrode 41c is coupled to the external electrode 1pin in.

The above capacitor units 60A and 60B and coil units 30 and 40 form the equivalent circuit illustrated in FIG. 22. The LC resonance circuits made up of L1 and C1, L2 and C2, L3 and C3, and L4 and C4 are formed between input and output external electrodes and function as a noise filter.

A noise circulating capacitance C61 is formed between the lead-out electrodes 81a and 82a, and a noise circulating capacitance C62 is formed between the lead-out electrodes 81b and 82b. In this way, generation of the noise circulating capacitances C61 and C62 in the multilayer structure enables controlling noise reflection and reducing noise.

Figure 23:
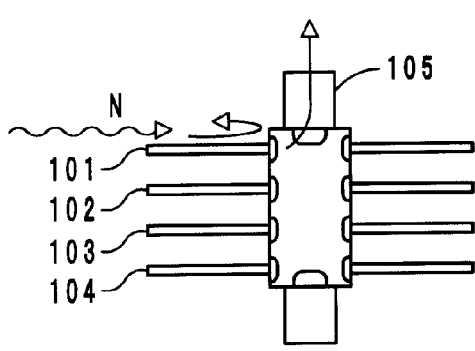
FIG. 23(A) is an illustration describing noise reduction action in a known example.
FIG. 23(B) is an illustration describing noise reduction action in embodiments.
Figure 23:
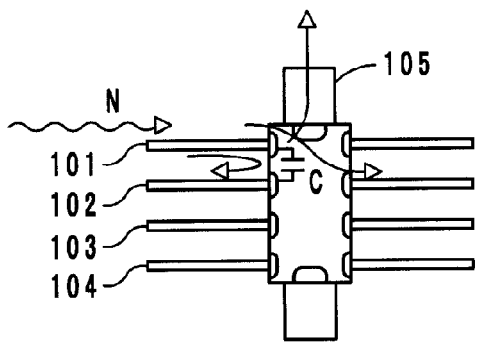

As a summary of various exemplary embodiments, a state in which noise arises with a known four-line LC composite electronic component is illustrated in FIG. 23(A). This reflects noise N flowing from an input side of four signal lines 101 to 104 to prevent an outflow of the noise to an output side. The noise N partly escapes through a ground line 105. A typical known four-line LC composite electronic component can reduce noise by reflecting the noise, but in an actual mounting state, that function is not always effectively performed. For example, if an input signal line is significantly longer than an output signal line, the noise level at the input side may be increased by reflected noise.

Regarding such an issue, the above embodiments can obtain a good noise control effect by having low reflection characteristics and thus mitigating an increase in noise level at the input side. The use of the internal configuration of the multilayer structure described in the embodiments can improve a noise control effect without an increase in an L value and a C value and contribute to a reduced size of the component.

A mechanism for low reflection characteristics according to the various exemplary embodiments consistent with the claimed invention is illustrated in FIG. 23(B). As shown, circulating capacitances C are formed between input external electrodes (in FIG. 23(B), only one formed between the signal lines 101 and 102 is illustrated). Thus, not all noise N flowing from the signal line 101 is reflected, the noise N is partly circulated in the input side or output side of the signal line 102, and another part of it also leaks to the ground line 105, so low reflection characteristics are obtainable.

Figure 24:
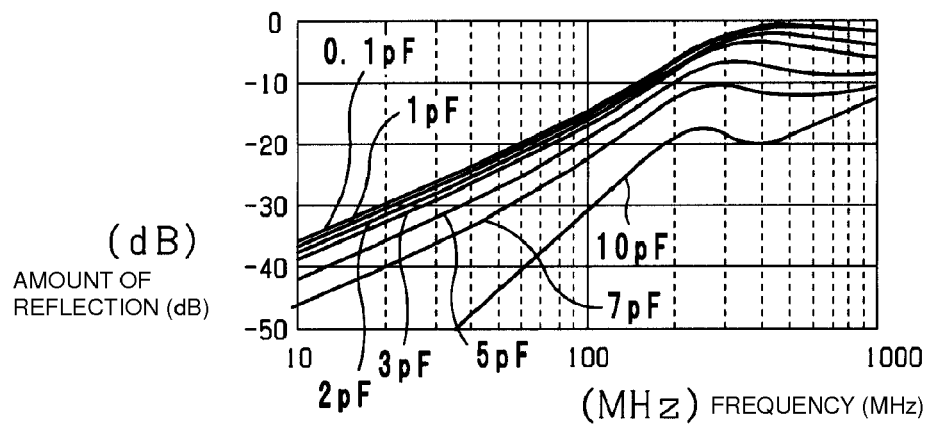
FIG. 24 is a graph illustrating reflection characteristics for each circulating capacitance value.
Figure 25:
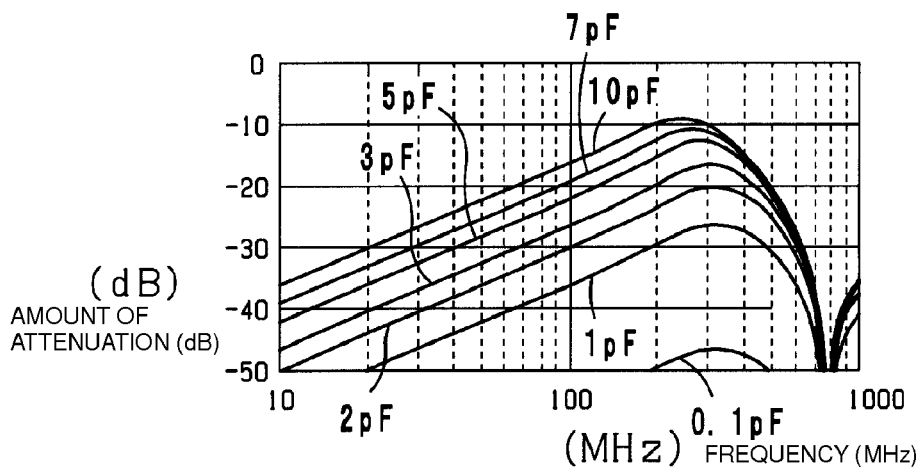
FIG. 25 is a graph illustrating attenuation characteristics for each circulating capacitance value.
Figure 26:
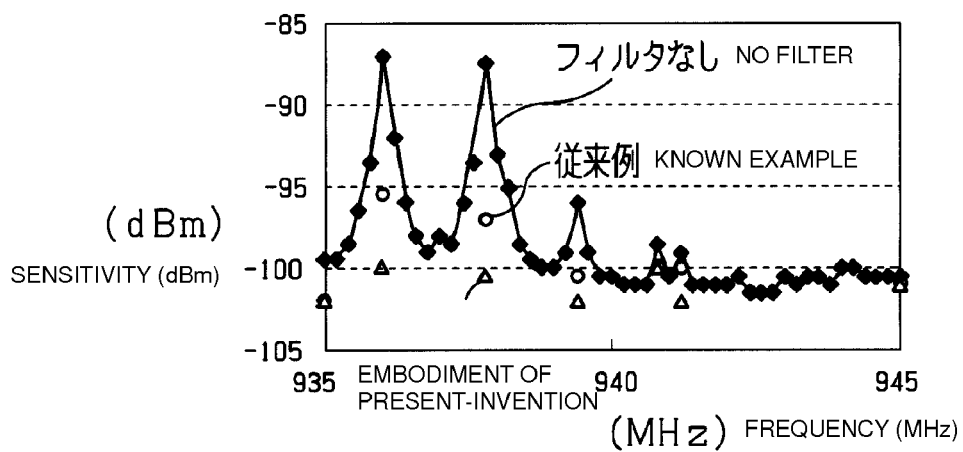
FIG. 26 is a graph illustrating noise suppression effects.
Figure 27:
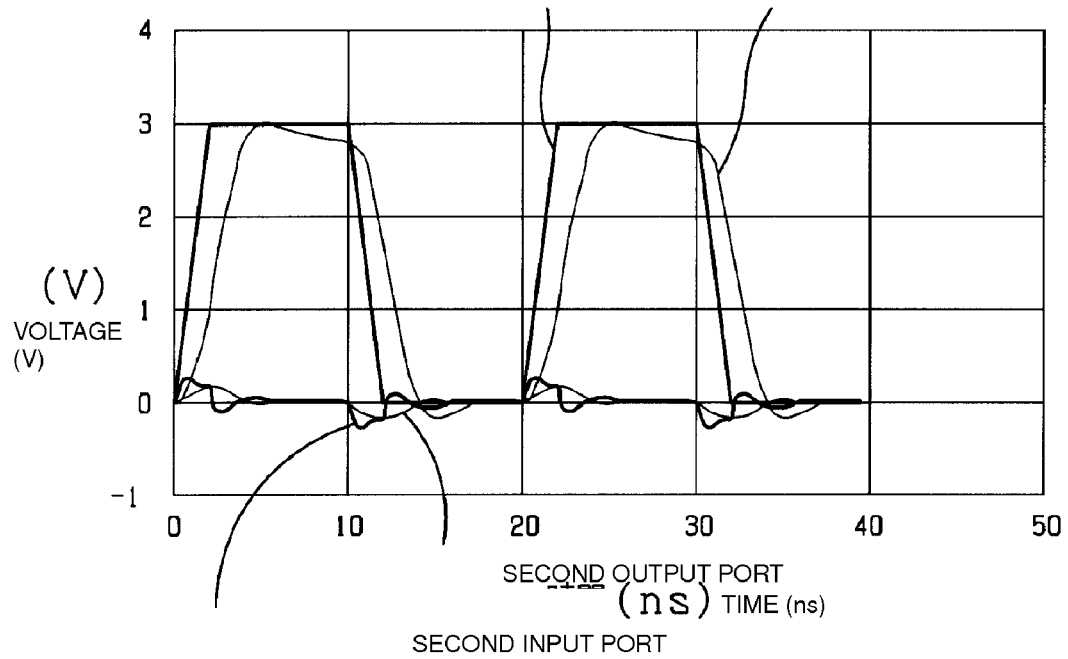
FIG. 27 is a graph illustrating how signals interfere among ports.

The formation of a circulating capacitance between input ports achieves the low reflection characteristics illustrated in FIG. 24. FIG. 24 illustrates reflection characteristics according to the above first embodiment for each C value (0.1 pF, 1 pF, 2 pF, 3 pF, 5 pF, 7pF, 10 pF) of the circulating capacitance. Its attenuation characteristics (isolation) between input and output ports decrease as illustrated in FIG. 25. In practice, a large decrease in isolation between signal lines leads to malfunction or unstable operation, so it is necessary to set the circulating capacitance at a proper value. To this end, a target value of the reflection characteristics is at or below −3 dB, and a target value of the isolation is at or below −14 dB. An amount of reflection of −3 dB is ½ power ratio, so when the amount of reflection in a noise frequency range in an estimation in mounting is at or below −3 dB, a noise control effect superior to that for a known LC composite electronic component is obtainable, as shown in FIG. 26.

As for isolation, in a four-line parallel transmission circuit, an inductive waveform produced between ports by an isolation decrease needs to be at or below 20% when it is at a low level with respect to the amplitude of a normal signal waveform and at or above 80% when it is at a high level. The above target value −14 dB corresponds to these thresholds (20%, 80%). Because a signal frequency used in a parallel transmission circuit is mostly at or below 150 MHz, the isolation is determined in 150 MHz. The circulating capacitance value satisfying such a condition may preferably be 2 to 7 pF from the characteristics illustrated in FIG. 24 and FIG. 25.

Figure 28:
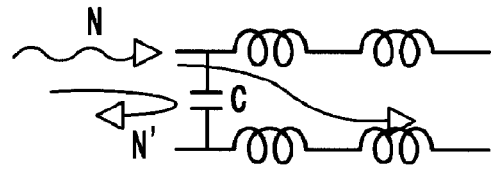
FIGS. 28(A) and 28(B) are illustrations describing noise reduction action effects depending on the position in which a circulating capacitance is inserted.
Figure 28:
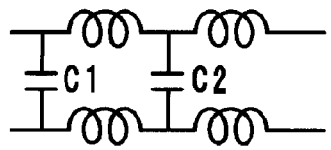

Next, the position in which a circulating capacitance is inserted is described. With the same value, the circulating capacitance may preferably be inserted between lead-out electrodes, not between coil layers. FIG. 28(A) illustrates a case where the circulating capacitance C is inserted between lead-out electrodes, and FIG. 28(B) illustrates a case where the circulating capacitances C1 and C2 are inserted between coil layers. When the circulating capacitances C1 and C2 are inserted between the coil layers, a distributed parameter type is set, and the circulating capacitances at a lead-out section decrease and reflection N' of noise N decreases. Additionally, a noise reduction effect of the circulating capacitance C2 inserted inside the coil is impaired by the circulating capacitance C1 inserted at the input side, so the reflection characteristics deteriorate.

Figure 29:
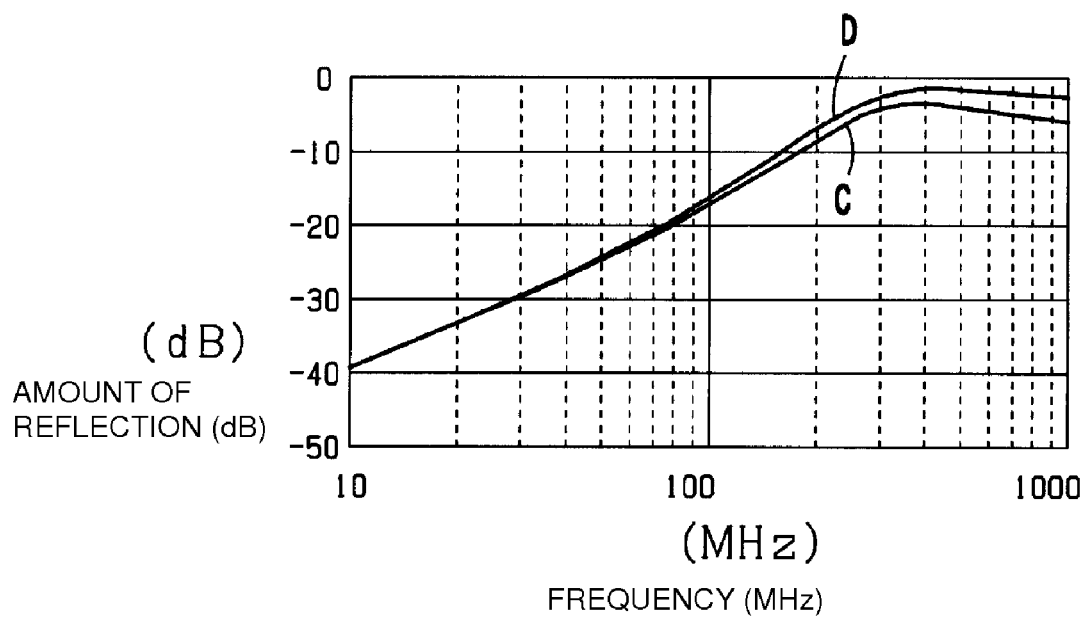
FIG. 29 is a graph that illustrates reflection characteristics depending on the position in which a circulating capacitance is inserted.

In FIG. 29, the characteristic curve C indicates the amount of reflection when the circulating capacitance C is inserted between lead-out electrodes, and the characteristic curve D indicates the amount of reflection where the circulating capacitances C1 and C2 are inserted between coil layers. As is also clear from FIG. 29, with the same value, preferable reflection characteristics are obtainable by inserting the circulating capacitance between lead-out electrodes, not between coil layers.

An LC composite electronic component according to the present invention is not limited to the above exemplary embodiments, and various modifications can be made within the scope of the present invention.

For example, a coil electrode and signal electrode in the embodiments can have any detailed shape and any layering mode can be used. Any number of capacitor units and any number of coil units can be incorporated in a single multilayer structure.

INDUSTRIAL APPLICABILITY

As described above, the exemplary embodiment consistent with the claimed invention are useful for an LC composite component including a plurality of inductor elements and capacitor elements and, in particular, advantageous in that a noise suppression effect is obtainable without an increase in size.

Although a limited number of embodiments are described herein, one of ordinary skill in the art will readily recognize that there could be variations to any of these embodiments and those variations would be within the scope of the appended claims. Thus, it will be apparent to those skilled in the art that various changes and modifications can be made to the communication system described herein without departing from the scope of the appended claims and their equivalents.

The invention claimed is:
1. An LC composite electronic component comprising:
a first capacitor unit in which a first ground electrode layer, having a first ground electrode formed on a first insulating layer, and a first signal electrode layer, having a first signal electrode formed on a second insulating layer, are stacked;
a first coil unit in which a first coil electrode layer, having a first coil electrode formed on a third insulating layer, is stacked;
a second capacitor unit in which a second ground electrode layer, having a second ground electrode formed on a fourth insulating layer, and a second signal electrode layer, having a second signal electrode formed on a fifth insulating layer, are stacked; and a second coil unit in which a second coil electrode layer, having a second coil electrode formed on a sixth insulating layer, are stacked, wherein the first capacitor unit and the first coil unit and the second capacitor unit and the second coil unit are stacked to form a multilayer structure, the LC composite electronic component further comprises:

a first external electrode disposed at the multilayer structure and coupled to a first end of the first coil electrode;

a second external electrode disposed at the multilayer structure and coupled to a second end of the first coil electrode;

a third external electrode disposed at the multilayer structure and coupled to a first end of the second coil electrode; and a fourth external electrode disposed at the multilayer structure and coupled to a second end of the second coil electrode;

the first coil unit further comprises:

a first lead-out electrode coupling the first coil electrode and the first external electrode; and a second lead-out electrode coupling the first coil electrode and the second external electrode;

the second coil unit comprises:

a third lead-out electrode coupling the second coil electrode and the third external electrode; and a fourth lead-out electrode coupling the second coil electrode and the fourth external electrode;

the first lead-out electrode and the third lead-out electrode face each other via a seventh insulating layer; and a first noise circulating capacitance is formed between the first lead-out electrode and the third lead-out electrode.

2. The LC composite electronic component according to claim 1, wherein a first resonance adjusting electrode is formed on an eighth insulating layer and between the first capacitor unit and the first coil unit;

a second resonance adjusting electrode is formed on a ninth insulating layer and between the second capacitor unit and the second coil unit;

the first resonance adjusting electrode is coupled with the third external electrode;

a first resonance adjusting capacitance is formed between the first resonance adjusting electrode and the first signal electrode;

the second resonance adjusting electrode is coupled with the first external electrode;

a second resonance adjusting capacitance is formed between the second resonance adjusting electrode and the second signal electrode;

a second noise circulating capacitance is formed between the first resonance adjusting electrode and the first coil electrode coupled with the second lead-out electrode; and a third noise circulating capacitance is formed between the second resonance adjusting electrode and the second coil electrode coupled with the fourth lead-out electrode.

3. The LC composite electronic component according to claim 1, wherein the first coil unit includes a resonance adjusting electrode formed on an eighth insulating layer, and a second noise circulating capacitance is formed between the resonance adjusting electrode of the first coil unit and the first coil electrode coupled to the second lead-out electrode.

4. The LC composite electronic component according to claim 1, wherein the second coil unit includes a resonance adjusting electrode formed on an eighth insulating layer, and a second noise circulating capacitance is formed between the resonance adjusting electrode of the second coil unit and the second coil electrode coupled to the fourth lead-out electrode.

5. The LC composite electronic component according to claim 1, wherein the noise circulating capacitance is 2 to 7 pF.

6. An LC composite electronic component comprising:

a first capacitor unit in which a first ground electrode layer, having a first ground electrode formed on a first insulating layer, and a first signal electrode layer having a first signal electrode formed on a second insulating layer, are stacked;

a first coil unit in which a first coil electrode layer having a first coil electrode formed on a third insulating layer is stacked;

a second capacitor unit in which a second ground electrode layer having a second ground electrode formed on a fourth insulating layer and a second signal electrode layer having a second signal electrode formed on a fifth insulating layer are stacked; and a second coil unit in which a second coil electrode layer having a second coil electrode formed on a sixth insulating layer is stacked, wherein the first capacitor unit, the first coil unit, the second capacitor unit, and the second coil unit are stacked to form a multilayer structure, and a noise circulating capacitance is formed between the first and second coil units.

7. The LC composite electronic component according to claim 6, further comprising a noise circulating capacitance electrode layer having a noise circulating capacitance electrode formed on a seventh insulating layer, the noise circulating capacitance layer being stacked between the first and second coil units.

8. The LC composite electronic component according to claim 6, wherein the noise circulating capacitance is formed by stacking the first coil electrode layer and the second coil electrode layer so as to face each other.

9. The LC composite electronic component according to claim 6, wherein the first coil electrode layer in the first coil unit comprises a plurality of first coil electrode layers, a first end of each of the first coil electrodes is coupled to the first signal electrode, and a second end thereof is coupled to a first external electrode, the second coil electrode layer in the second coil unit comprises a plurality of second coil electrode layers, a first end of each of the second coil electrodes is coupled to the second signal electrode, and a second end thereof is coupled to a second external electrode, and the coil electrode forming the second end of each of the first coil electrode and the second coil electrode forms the noise circulating capacitance.

10. The LC composite electronic component according to claim 9, wherein the noise circulating capacitance is 2 to 7 pF.

11. The LC composite electronic component according to claim 6, wherein the noise circulating capacitance is 2 to 7 pF.

* * * * *